United States Patent
Ono

(10) Patent No.: US 10,204,973 B2
(45) Date of Patent: Feb. 12, 2019

(54) DISPLAY DEVICE AND THIN-FILM TRANSISTORS SUBSTRATE

(71) Applicant: JOLED INC., Tokyo (JP)

(72) Inventor: Shinya Ono, Osaka (JP)

(73) Assignee: JOLED INC., Tokyo (JP)

(*) Notice: Subject to any disclaimer, the term of this patent is extended or adjusted under 35 U.S.C. 154(b) by 292 days.

(21) Appl. No.: 15/110,217

(22) PCT Filed: Dec. 22, 2014

(86) PCT No.: PCT/JP2014/006374
§ 371 (c)(1),
(2) Date: Jul. 7, 2016

(87) PCT Pub. No.: WO2015/107606
PCT Pub. Date: Jul. 23, 2015

(65) Prior Publication Data
US 2016/0329390 A1    Nov. 10, 2016

(30) Foreign Application Priority Data

Jan. 15, 2014    (JP) .................................. 2014-005091

(51) Int. Cl.
*H01L 29/08*    (2006.01)
*H01L 27/32*    (2006.01)
(Continued)

(52) U.S. Cl.
CPC ........ *H01L 27/3262* (2013.01); *H01L 27/124* (2013.01); *H01L 27/1225* (2013.01);
(Continued)

(58) Field of Classification Search
CPC ...................................................... H01L 28/75
(Continued)

(56) References Cited

U.S. PATENT DOCUMENTS 6,278,504 B1    8/2001    Sung
8,309,956 B2    11/2012   Arai et al.
(Continued)

FOREIGN PATENT DOCUMENTS

JP    09-203908    8/1997
JP    11-112003    4/1999
(Continued)

OTHER PUBLICATIONS

International Search Report (ISR) from International Searching Authority (Japan Patent Office) in International Pat. Appl. No. PCT/JP2014/006374, dated Mar. 24, 2015.
(Continued)

*Primary Examiner* — Ajay K Arora
(74) *Attorney, Agent, or Firm* — Greenblum & Bernstein, P.L.C.

(57) ABSTRACT

A display device includes a pixel circuit that includes a thin-film transistor. The thin-film transistor includes a gate electrode, a semiconductor layer formed above the gate electrode, a gate insulating layer formed between the gate electrode and the semiconductor layer, a channel protective layer formed on the semiconductor layer, and a source electrode and a drain electrode that are formed above the channel protective layer and electrically connected to the semiconductor layer. The source electrode and the drain electrode are formed in different layers.

13 Claims, 16 Drawing Sheets

(51) Int. Cl.
  *H01L 29/417* (2006.01)
  *H01L 27/12* (2006.01)
(52) U.S. Cl.
  CPC .... *H01L 27/3276* (2013.01); *H01L 29/41733* (2013.01); *H01L 27/3272* (2013.01)
(58) Field of Classification Search
  USPC .............................................. 247/40; 257/40
  See application file for complete search history.

(56) References Cited

U.S. PATENT DOCUMENTS

| | | | |
|---|---|---|---|
| 8,815,619 | B2 | 8/2014 | Arai et al. |
| 9,069,219 | B2 | 6/2015 | Misaki |
| 2007/0152222 | A1* | 7/2007 | Joo ..................... H01L 27/3251 257/72 |
| 2009/0020759 | A1 | 1/2009 | Yamazaki |
| 2010/0133525 | A1 | 6/2010 | Arai et al. |
| 2010/0134398 | A1 | 6/2010 | Toyota et al. |
| 2011/0278577 | A1 | 11/2011 | Yamazaki |
| 2012/0229524 | A1* | 9/2012 | Toshima ............. G09G 3/3648 345/690 |
| 2013/0089940 | A1 | 4/2013 | Arai et al. |
| 2013/0201420 | A1* | 8/2013 | Misaki ................ H01L 27/1225 349/46 |
| 2015/0097163 | A1 | 4/2015 | Kanno et al. |

FOREIGN PATENT DOCUMENTS

| | | |
|---|---|---|
| JP | 2009-049384 | 3/2009 |
| JP | 2010-129859 | 6/2010 |
| JP | 2010-135462 | 6/2010 |
| JP | 2011-009490 | 1/2011 |
| JP | 2013-084669 | 5/2013 |
| JP | 2013-183051 | 9/2013 |
| JP | 2013-229453 | 11/2013 |
| JP | 2014-232824 | 12/2014 |
| WO | 2012/020525 | 2/2012 |

OTHER PUBLICATIONS

Office Action from Japan Patent Office (JPO) in Japanese Patent Appl. No. 2015-557597, dated Dec. 12, 2017.

* cited by examiner (a)

(b)

(c)

(d)

(e)

DISPLAY DEVICE AND THIN-FILM TRANSISTORS SUBSTRATE

TECHNICAL FIELD

The present disclosure relates to a display device and a thin-film transistor substrate.

BACKGROUND ART

Thin-film transistors (TFTs) are widely used as switching elements or driving elements in active matrix display devices such as liquid crystal display devices and organic electroluminescent (EL) display devices.

In recent years, there has been a demand for display devices having larger screen sizes and being manufacturable at lower cost. In general, using thin-film transistors that have a bottom-gate type structure in which a gate electrode is formed on the substrate side of a channel layer and that use in combination an amorphous or microcrystalline channel layer made of Si or InGaZnO makes it possible to easily reduce cost. The bottom gate-type thin-film transistors are roughly divided into two types: channel etched type thin-film transistors in which the channel layer is etched, and channel protection type (etching stopper type) thin-film transistors in which the channel layer is protected from etching.

The channel protection type thin-film transistors are capable of preventing damage to the channel layer due to an etching process and suppressing variations in characteristics and changes over time in characteristics in the substrate surface. The channel protection type thin-film transistors are more advantageous in terms of speedup and high definition because reducing the thickness of a gate insulating film and increasing the thickness of a channel protective layer can reduce parasitic resistance components generated by crossing of interconnect lines and can reduce a time constant related to data writing while improving the on-state characteristics of the TFTs.

For example, Patent Literature (PTL) 1 discloses a channel protection type thin-film transistor that uses a microcrystalline semiconductor thin film as a channel layer. The thin-film transistor of PTL 1 has a source electrode and a drain electrode on a channel protective layer. The source electrode and the drain electrode are electrically connected to a semiconductor layer through contact holes formed in the channel protective layer.

CITATION LIST

Patent Literature

[PTL 1]
Japanese Unexamined Patent Application Publication No. 2010-135462

SUMMARY OF INVENTION

Technical Problem

There is the problem with the above conventional channel protection type thin-film transistors that the on-state resistance cannot be reduced sufficiently.

In order to reduce the on-state resistance, for example, the channel length of the semiconductor layer of the thin-film transistor may be reduced. The channel length depends on the distance between a contact region for contact with the source electrode and a contact region for contact with the drain electrode. Thus, the distance between the contact region for contact with the source electrode and the contact region for contact with the drain electrode may be reduced in order to reduce the channel length.

However, the source electrode and the drain electrode have to be physically isolated from each other. Thus, there is a limit to reducing the distance between the contact region for contact with the source electrode and the contact region for contact with the drain electrode in the above conventional channel protection type thin-film transistors.

In view of this, the present disclosure provides a display device that includes a thin-film transistor having a reduced on-state resistance, and a thin-film transistor substrate.

Solution to Problem

To solve the above-described problem, a display device according to an embodiment of the present disclosure is a display device including a pixel circuit that includes a thin-film transistor. The thin-film transistor includes a gate electrode, a semiconductor layer formed above the gate electrode, a gate insulating layer formed between the gate electrode and the semiconductor layer, a first insulating layer formed on the semiconductor layer, and a source electrode and a drain electrode that are formed above the first insulating layer and electrically connected to the semiconductor layer. The source electrode and the drain electrode are formed in different layers.

Advantageous Effects of Invention

The present disclosure provides a display device that includes a thin-film transistor having a reduced on-state resistance, and a thin-film transistor substrate.

DESCRIPTION OF EMBODIMENTS

Overview of Present Disclosure

Figure 1:
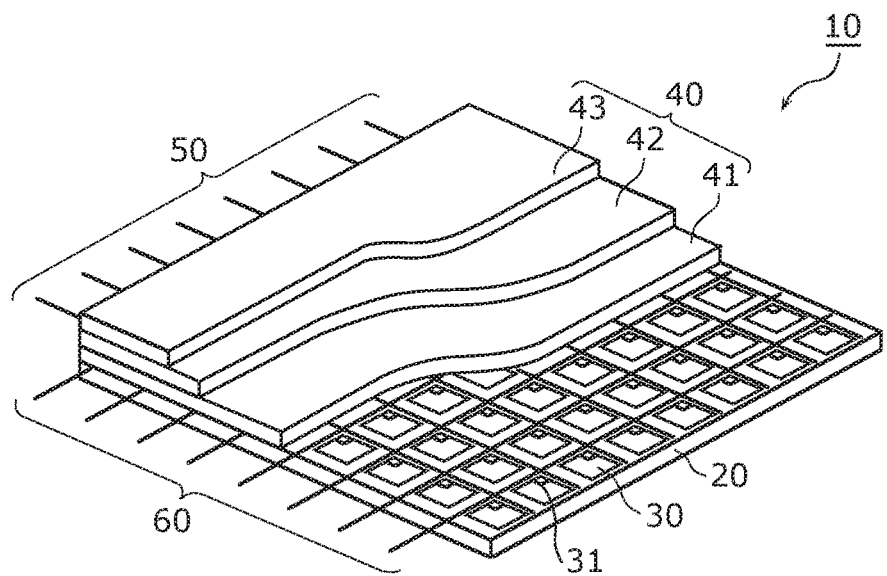
FIG. 1 is a cutaway perspective view of part of an organic EL display device according to an embodiment.

A display device according to an embodiment of the present disclosure is a display device including a pixel circuit that includes a thin-film transistor. The thin-film transistor includes a gate electrode, a semiconductor layer formed above the gate electrode, a gate insulating layer formed between the gate electrode and the semiconductor layer, a first insulating layer formed on the semiconductor layer, and a source electrode and a drain electrode that are formed above the first insulating layer and electrically connected to the semiconductor layer. The source electrode and the drain electrode are formed in different layers.

The configuration in which the source electrode and the drain electrode are formed in different layers eliminates the need to separate the source electrode and the drain electrode in the horizontal direction of the substrate, thus reducing the length of a channel region (channel length).

In the display device according to the embodiment of the present disclosure, for example, the first insulating layer has a first contact hole for connecting the source electrode to the semiconductor layer and a second contact hole for connecting the drain electrode to the semiconductor layer. The channel region of the semiconductor layer that is between the first contact hole and the second contact hole may be located within the gate electrode in a plan view.

This configuration allows the entire channel region to be controlled by the gate voltage applied to the gate electrode, thus suppressing formation of a high-resistance region in the channel region and suppressing an increase in the on-state resistance.

In the display device according to the embodiment of the present disclosure, for example, the semiconductor layer may be located within the gate electrode in a plan view.

This configuration allows the entire semiconductor layer to be controlled by the gate voltage applied to the gate electrode, thus suppressing formation of a high-resistance region in the channel region and suppressing an increase in the on-state resistance.

In the display device according to the embodiment of the present disclosure, for example, the first insulating layer may have a first contact hole for connecting the source electrode to the semiconductor layer and a second contact hole for connecting the drain electrode to the semiconductor layer, and the channel region of the semiconductor layer that is between the first contact hole and the second contact hole may be covered with at least one of the source electrode and the drain electrode in a plan view.

This configuration in which the channel region is covered with at least one of the source electrode and the drain electrode, for example, suppresses the arrival of light from the outside at the channel region when the source electrode and the drain electrode are made of a light shielding material. Thus, it is possible to suppress both degradation of characteristics of the thin-film transistor due to photo-deterioration of the channel region and an increase in the off-state current due to carriers being excited by the light.

In the display device according to the embodiment of the present disclosure, for example, the semiconductor layer may be covered with at least one of the source electrode and the drain electrode in a plan view.

This configuration in which the semiconductor layer is covered with at least one of the source electrode and the drain electrode, for example, suppresses the arrival of light from the outside at the semiconductor layer when the source electrode and the drain electrode are made of a light shielding material. Thus, it is possible to suppress both degradation of characteristics of the thin-film transistor due to photo-deterioration of the semiconductor layer and an increase in the off-state current due to carriers being excited by the light.

In the display device according to the embodiment of the present disclosure, for example, the source electrode and the drain electrode may be made of a light shielding material.

In the display device according to the embodiment of the present disclosure, for example, the thin-film transistor may further include a second insulating layer formed above the first insulating layer, and one of the source electrode and the drain electrode may be formed on the first insulating layer, and the other of the source electrode and the drain electrode may be formed on the second insulating layer.

In the display device according to the embodiment of the present disclosure, for example, the thin-film transistor may be a driving transistor for driving light-emitting devices of the pixel circuit, and the source electrode may be formed above the drain electrode.

This configuration allows the characteristics of a saturation region of the driving transistor to be more flat, thus improving uniformity of display.

The display device according to the embodiment of the present disclosure may, for example, include organic light-emitting devices formed above the thin-film transistor.

A thin-film transistor substrate according to an embodiment of the present disclosure may, for example, be a thin-film transistor substrate including a thin-film transistor, and include a gate electrode, a semiconductor layer formed above the gate electrode, a gate insulating layer formed between the gate electrode and the semiconductor layer, an insulating layer formed on the semiconductor layer, and a source electrode and a drain electrode that are formed above the insulating layer and electrically connected to the semiconductor layer. The source electrode and the drain electrode may be formed in different layers.

Hereinafter, embodiments of the thin-film transistor substrate, the method of manufacturing the thin-film transistor substrate, and the display device including the thin-film transistor substrate will be described with reference to the drawings. Note that the embodiments described below are preferable specific examples according to the present disclosure. Thus, for example, numerical values, shapes, materials, constituent elements, layout positions and connection forms of the constituent elements, steps, and the order in which the steps are performed in the following embodiments are all merely examples and not intended to limit the present invention. Accordingly, those among the constituent elements in the following embodiments that are not recited in any of independent claims, which define the broadest concept of the present invention, are described as arbitrary constituent elements.

Note that the drawings are schematic diagrams and do not always strictly follow the actual configuration. In the drawings, constituent elements that are substantially the same are given the same reference numerals, and a redundant description thereof is either omitted or simplified.

Embodiment 1

Organic EL Display Device

First, a configuration of an organic EL display device 10 according to an embodiment of the present invention will be described with reference to FIG. 1. FIG. 1 is a cutaway perspective view of part of the organic EL display device according to the present embodiment.

As illustrated in FIG. 1, the organic EL display device 10 has a laminated structure constituted by a TFT substrate (TFT array substrate) 20 on which a plurality of thin-film transistors are arranged, and organic EL elements (light emitting part) 40 that include an anode 41, an EL layer 42, and a cathode 43, the anode 41 being a lower electrode, the EL layer 42 being a light emitting layer made of an organic material, and the cathode 43 being a transparent upper electrode.

The TFT substrate 20 has a plurality of pixels 30 arranged in a matrix, each pixel 30 including a pixel circuit 31.

The organic EL elements 40 correspond respectively to the pixels 30, and the pixel circuit 31 of each pixel 30 controls light emission of each organic EL element 40. The organic EL elements 40 are formed on an interlayer insulation film (flattened film) that is formed to cover a plurality of thin-film transistors.

The organic EL elements 40 are configured such that the EL layer 42 is arranged between the anode 41 and the cathode 43. A hole transfer layer is further laminated between the anode 41 and the EL layer 42, and an electron transfer layer is further laminated between the EL layer 42 and the cathode 43. Note that other organic functional layers may be provided between the anode 41 and the cathode 43.

Each pixel 30 is driven and controlled by the pixel circuit 31. The TFT substrate 20 also includes a plurality of gate interconnect lines (scanning lines) 50 that are arranged in a row direction of the pixels 30, a plurality of source interconnect lines (signal interconnect lines) 60 that are arranged in a column direction of the pixels 30 to intersect with the gate interconnect lines 50, and a plurality of power interconnect lines (not shown in FIG. 1) that are arranged in parallel with the source interconnect lines 60. For example, each pixel 30 is partitioned by the gate interconnect lines 50 and the source interconnect lines 60 that are orthogonal to each other.

The gate interconnect lines 50 are connected respectively to the rows of gate electrodes of thin-film transistors that are included in each pixel circuit 31 and operate as switching elements. The source interconnect lines 60 are connected respectively to the columns of source electrodes of the thin-film transistors that are included in each pixel circuit 31 and operate as switching elements. The power interconnect lines are connected respectively to the columns of drain electrodes of thin-film transistors that are included in each pixel circuit 31 and operate as driving elements.

Figure 2:
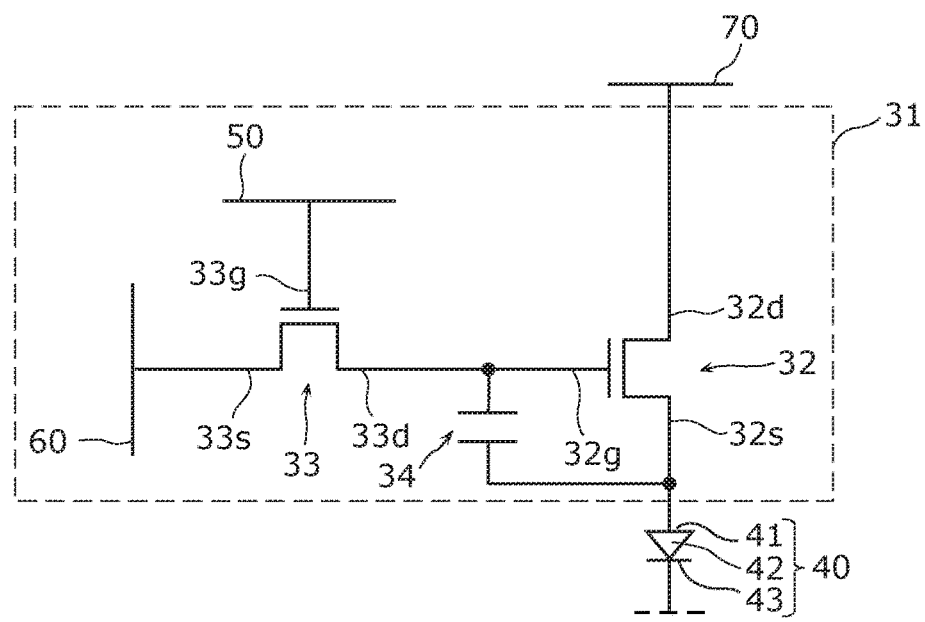
FIG. 2 is an electric circuit diagram illustrating a configuration of a pixel circuit of the organic EL display device according to the embodiment.

Here, the circuit configuration of the pixel circuits 31 of the pixels 30 will be described with reference to FIG. 2. FIG. 2 is an electric circuit diagram illustrating the configuration of a pixel circuit in the organic EL display device according to the present embodiment.

As illustrated in FIG. 2, the pixel circuit 31 includes a thin-film transistor 32 that operates as a driving element, a thin-film transistor 33 that operates as a switching element, and a capacitor 34 that stores data to be displayed on the corresponding pixel 30. In the present embodiment, the thin-film transistor 32 is a driving transistor for driving the organic EL element 40, and the thin-film transistor 33 is a switching transistor for selecting the pixel 30.

The thin-film transistor 32 includes a gate electrode $32g$ that is connected to a drain electrode $33d$ of the thin-film transistor 33 and one end of the capacitor 34, a drain electrode $32d$ that is connected to a power interconnect line 70, a source electrode $32s$ that is connected to the other end of the capacitor 34 and the anode 41 of the organic EL element 40, and a semiconductor film (not shown). This thin-film transistor 32 supplies a current that corresponds to data voltage stored in the capacitor 34 from the power interconnect line 70 through the source electrode $32s$ to the anode 41 of the organic EL element 40. As a result, in the organic EL element 40, the driving current flows from the anode 41 to the cathode 43 and the EL layer emits light.

The thin-film transistor 33 includes a gate electrode $33g$ that is connected to a gate interconnect line 50, a source electrode $33s$ that is connected to a source interconnect line 60, the drain electrode $33d$ that is connected to one end of the capacitor 34 and the gate electrode $32g$ of the thin-film transistor 32, and a semiconductor film (not shown). In this thin-film transistor 33, when a predetermined voltage is applied to the connected gate interconnect line 50 and source interconnect line 60, the voltage applied to the source interconnect line 60 is stored as the data voltage in the capacitor 34.

Note that the organic EL display device 10 with the above-described configuration adopts an active matrix method in which display control is performed for each pixel 30 located at the intersection of a gate interconnect line 50 and a source interconnect line 60. Thus, a desired image is displayed by the thin-film transistors 32 and 33 of each pixel 30 (sub pixels R, G, and B) causing the corresponding organic EL element 40 to selectively emit light.

Figure 3:
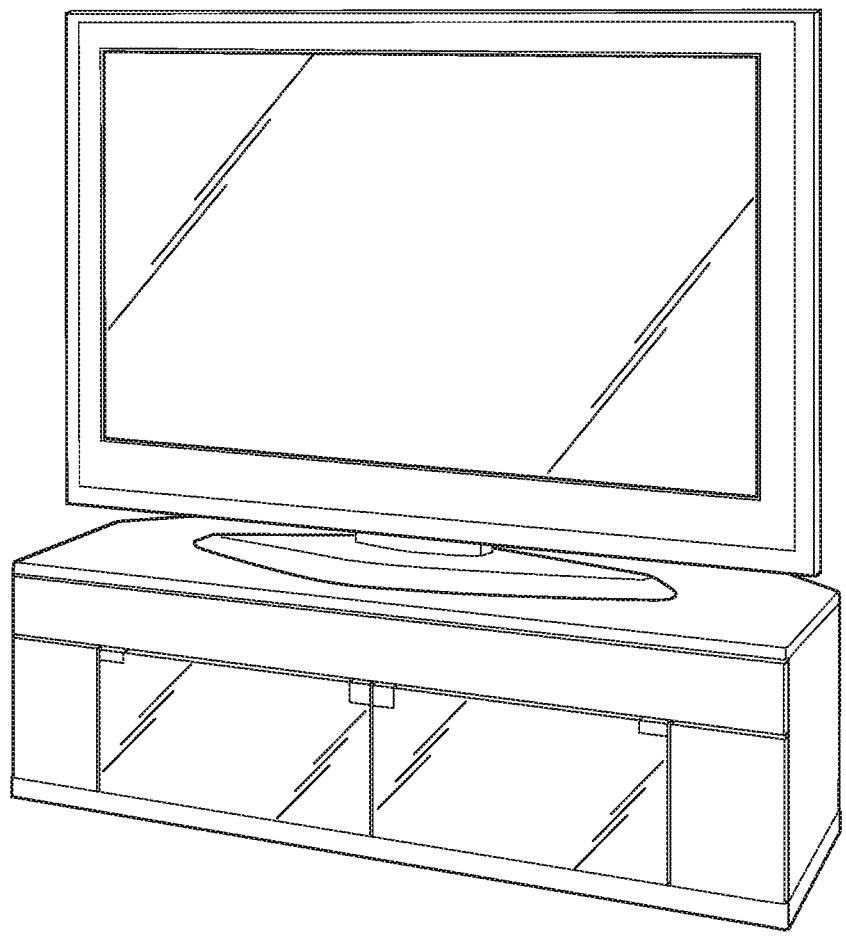
FIG. 3 is an external view of an exemplary organic EL display device according to the embodiment.

The organic EL display device 10 configured as described above can be used as, for example, a television as illustrated in FIG. 3. FIG. 3 is an external view illustrating an example of the organic EL display device 10 according to the present embodiment.

Thin-Film Transistor

Hereinafter, the thin-film transistors according to the present embodiment will be described with reference to FIGS. 4, 5A, and 5B. Note that the thin-film transistors of the present embodiment are bottom-gate type and channel protection type thin-film transistors.

Figure 4:
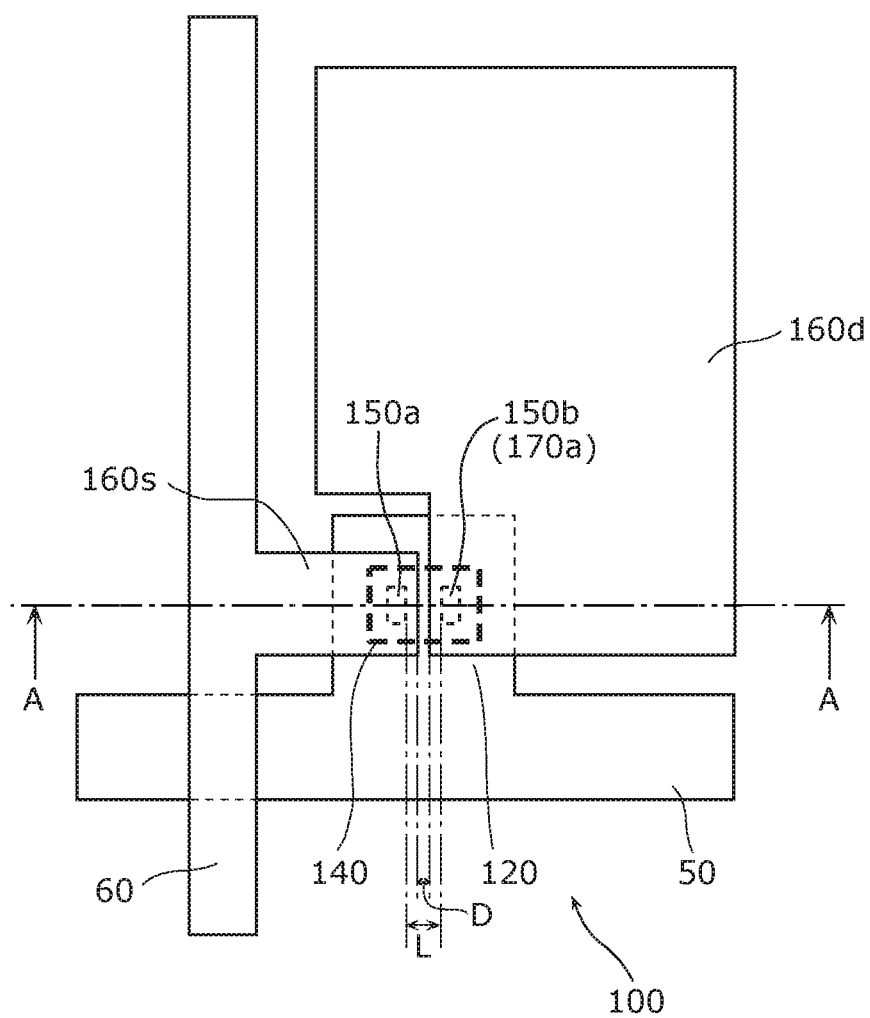
FIG. 4 is a plan view of an exemplary thin-film transistor according to the embodiment.

FIG. 4 is a plan view of the thin-film transistor 100 of the present embodiment. FIGS. 5A and 5B are schematic cross-sectional views of the thin-film transistor 100 of the present embodiment. Note that FIGS. 5A and 5B illustrate a cross section taken along A-A in FIG. 4.

Figure 5A:
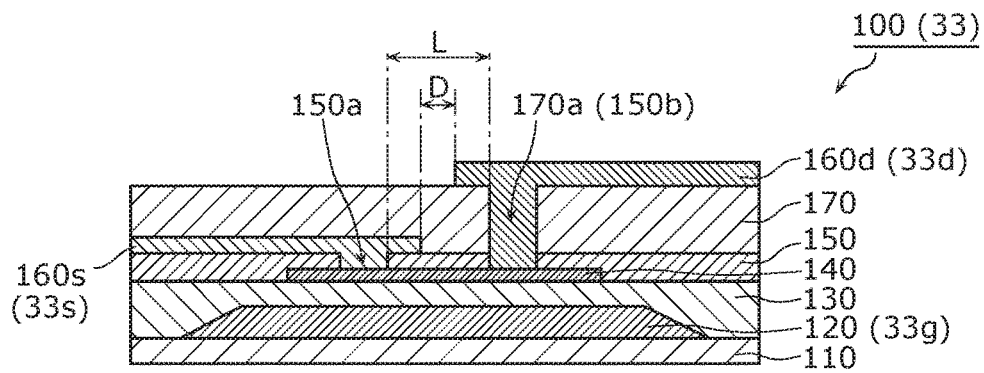
FIG. 5A is a schematic cross-sectional view of the exemplary thin-film transistor according to the embodiment.
Figure 5B:
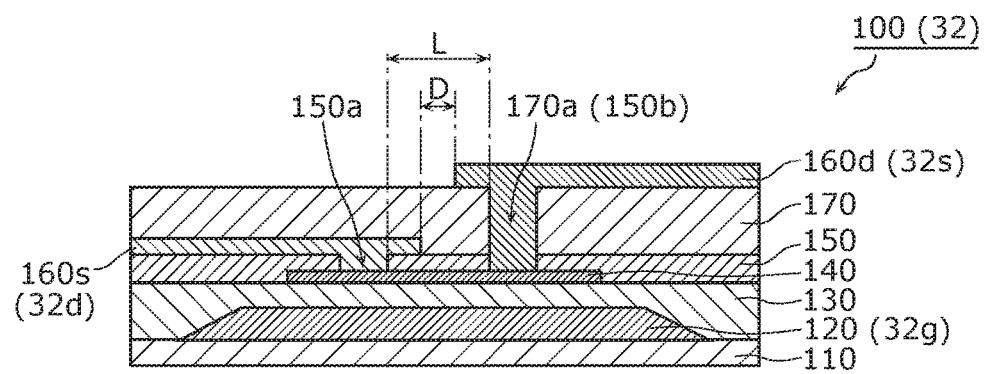
FIG. 5B is a schematic cross-sectional view of another exemplary thin-film transistor according to the embodiment.

As illustrated in FIGS. 5A and 5B, the thin-film transistor 100 of the present embodiment includes a substrate 110, a gate electrode 120, a gate insulating layer 130, a semiconductor layer 140, a channel protective layer 150, a source electrode 160s (lower electrode), a drain electrode 160d (upper electrode), and an interlayer insulating layer 170.

The thin-film transistor 100 may, for example, be the thin-film transistor 33 illustrated in FIG. 2. That is, the thin-film transistor 100 can be used as a switching transistor.

Specifically, when the thin-film transistor 100 is the thin-film transistor 33 (switching transistor) as illustrated in FIG. 5A, the gate electrode 120, the source electrode 160s, and the drain electrode 160d correspond respectively to the gate electrode 33g, the source electrode 33s, and the drain electrode 33d. As illustrated in FIG. 4, the gate electrode 120 is connected to the gate interconnect line 50, the source electrode 160s is connected to the source interconnect line 60, and the drain electrode 160d is connected one end of the capacitor 34.

Note that the source electrode 33s may correspond to the upper electrode (drain electrode 160d), and the drain electrode 33d may correspond to the lower electrode (source electrode 160s). In other words, the lower electrode (source electrode 160s) may correspond to one of the source electrode 33s and the drain electrode 33d, and the upper electrode (drain electrode 160d) may correspond to the other of the drain electrode 33d and the source electrode 33s.

Alternatively, the thin-film transistor 100 may, for example, be the thin-film transistor 32 illustrated in FIG. 2. That is, the thin-film transistor 100 may be used as a driving transistor. In this case, the source electrode 32s may be formed above the drain electrode 32d. That is, the upper electrode is used as the source electrode 32s, and the lower electrode is used as the drain electrode 32d.

Specifically, when the thin-film transistor 100 is the thin-film transistor 32 (driving transistor) as illustrated in FIG. 5B, the gate electrode 120, the upper electrode (drain electrode 160d), and the lower electrode (source electrode 160s) correspond respectively to the gate electrode 32g, the source electrode 32s, and the drain electrode 32d. This configuration allows the characteristics of the saturation region to be more flat, thus improving uniformity of display.

The substrate 110 is a substrate made of a material having electrical insulating properties. The substrate 110 may, for example, be a substrate made of a glass material such as no alkali glass, silica glass, or high heat-resistant glass; a resin material such as polyethylene, polypropylene, or polyimide; a semiconductor material such as silicon or gallium arsenide; or a metallic material such as stainless steel coated with an insulating layer.

The substrate 110 may be a flexible substrate such as a resin substrate. In this case, the thin-film transistor 100 can be used in a flexible display.

The gate electrode 120 is formed in a predetermined shape on the substrate 110. The gate electrode 120 has a film thickness of, for example, 20 nm to 1000 nm. The gate electrode 120 may be formed above the substrate 110, for example, via a buffer layer.

The gate electrode 120 is an electrode made of a material having electrical conductivity. Examples of the material for the gate electrode 120 include metals such as molybdenum, aluminum, copper, tungsten, titanium, manganese, chromium, tantalum, niobium, silver, gold, platinum, palladium, indium, nickel, and neodymium; alloys of metals; conductive metallic oxides such as indium tin oxide (ITO), indium zinc oxide (IZO), aluminum-doped zinc oxide (AZO), and gallium-doped zinc oxide (GZO); and conductive polymers such as polythiophene or polyacethylene. Alternatively, the gate electrode 120 may have a multilayer structure configured by laminating these materials.

The gate insulating layer 130 is formed between the gate electrode 120 and the semiconductor layer 140. Specifically, the gate insulating layer 130 is formed on the gate electrode 120 and on the substrate 110 to cover the gate electrode 120. The gate insulating layer 130 has a film thickness of, for example, 50 nm to 500 nm.

The gate insulating layer 130 is made of a material having electrical insulating properties. For example, the gate insulating layer 130 may be a single-layer film such as a silicon oxide film, a silicon nitride film, a silicon oxynitride film, an aluminum oxide film, a tantalum oxide film, a hafnium oxide film, or a titanium oxide film; or a laminated film of these single-layer films.

The semiconductor layer 140 is formed above the substrate 110 to face the gate electrode 120. Specifically, the semiconductor layer 140 is formed at a position facing the gate electrode 120 on the gate insulating layer 130. For example, the semiconductor layer 140 is formed in an island shape on the gate insulating layer 130 above the gate electrode 120. The semiconductor layer 140 is used as a channel layer of the thin-film transistor 100. The semiconductor layer 140 has a film thickness of, for example, 20 nm to 500 nm.

The material for the semiconductor layer 140 may be silicon (Si) having a crystal or non-crystal structure, or may be an oxide semiconductor material that contains at least one of indium (In), gallium (Ga), zinc (Zn), and tin (Sn). For example, the semiconductor layer 140 may be made of a transparent amorphous oxide semiconductor (TAOS) such as amorphous indium-gallium-zinc-oxide (InGaZnO: IGZO).

The ratio of In, Ga, and Zn may, for example, be approximately 1:1:1. The ratio of In, Ga, and Zn may be in the range of 0.8-1.2:0.8-1.2:0.8-1.2, but is not limited to this range.

Note that the thin-film transistor in which the channel layer is made of a transparent amorphous oxide semiconductor exhibits high carrier mobility and is suitable for a large-screen, high-definition display device. The transparent amorphous oxide semiconductor can be easily formed on a flexible substrate such as a plastic or a film because the semiconductor can be deposited at low temperatures.

The channel protective layer 150 is one example of the first insulating layer formed on the semiconductor layer 140. For example, the channel protective layer 150 is formed on the semiconductor layer 140 and on the gate insulating layer 130 to cover the semiconductor layer 140. The channel protective layer 150 has a film thickness of, for example, 50 nm to 1000 nm.

The channel protective layer 150 is made of a material having electrical insulating properties. For example, the channel protective layer 150 may be a film made of an inorganic material such as a silicon oxide film, a silicon nitride film, a silicon oxynitride film, or an aluminum oxide film; a single-layer film such as a film made of an inorganic material that contains silicon, oxygen, and carbon; or a laminated film of these films.

Part of the channel protective layer 150 has an opening that penetrates through the channel protective layer. That is, the channel protective layer 150 has contact holes 150a and 150b for exposing part of the semiconductor layer 140.

The contact hole 150a is a contact hole for exposing a source contact region of the semiconductor layer 140 to electrically connect the source electrode 160s and the semiconductor layer 140. The material for the source electrode 160s, for example, reaches the semiconductor layer 140 along the wall surface of the contact hole 150a. Alternatively, the contact hole 150a may be filled with the material for the source electrode 160s.

The contact hole 150b is a contact hole for exposing a drain contact region of the semiconductor layer 140 to electrically connect the drain electrode 160d and the semiconductor layer 140. The material for the drain electrode 160d, for example, reaches the semiconductor layer 140 along the wall surface of the contact hole 150b. Alternatively, the contact hole 150b may be filled with the material for the drain electrode 160d.

The source electrode 160s is formed in a predetermined shape on the channel protective layer 150. Specifically, the source electrode 160s is formed on the channel protective layer 150 so as to be connected to the semiconductor layer 140 through the contact hole 150a. The source electrode 160s has a film thickness of, for example, 100 nm to 500 nm.

The drain electrode 160d is formed in a predetermined shape on the interlayer insulating layer 170. Specifically, the drain electrode 160d is formed on the interlayer insulating layer 170 so as to be connected to the semiconductor layer 140 through the contact hole 150b and a contact hole 170a of the interlayer insulating layer 170. The drain electrode 160d has a film thickness of, for example, 100 nm to 1000 nm. Note that the drain electrode 160d may also be used as a pixel electrode (anode electrode) of the organic EL element.

The source electrode 160s and the drain electrode 160d are electrodes made of a material having electrical conductivity. The source electrode 160s and the drain electrode 160d may, for example, be made of the same material as the material for the gate electrode 120. Specifically, the source electrode 160s and the drain electrode 160d are electrodes made of a light shielding material such as metal.

The interlayer insulating layer 170 is one example of the second insulating layer formed above the channel protective layer 150. The interlayer insulating layer 170 is formed on the channel protective layer 150 and the source electrode 160s. For example, the interlayer insulating layer 170 is formed on the channel protective layer 150 and on the source electrode 160s to cover the source electrode 160s. The interlayer insulating layer 170 has a film thickness of, for example, 100 nm to 1000 nm.

The interlayer insulating layer 170 is made of a material having electrical insulating properties. The interlayer insulating layer 170 may, for example, be a film made of an inorganic material such as a silicon oxide film, a silicon nitride film, a silicon oxynitride film, an aluminum oxide film, a tantalum oxide film, a hafnium oxide film, or a titanium oxide film; a single-layer film such as a film made of an inorganic material that contains silicon, oxygen, and carbon; or a laminated film of these films.

Part of the interlayer insulating layer 170 has an opening that penetrates through the interlayer insulating layer. That is, the interlayer insulating layer 170 has the contact hole 170a for exposing part of the semiconductor layer 140.

The contact hole 170a is a contact hole for electrically connecting the drain electrode 160d and the semiconductor layer 140. The contact hole 170a is contiguous with the contact hole 150b of the channel protective layer 150. The material for the drain electrode 160d, for example, reaches the semiconductor layer 140 along the wall surfaces of the contact holes 170a and 150b. Alternatively, the contact hole 170a may be filled with the material for the drain electrode 160d.

As described above, the source electrode 160s and the drain electrode 160d of the thin-film transistor 100 according to the present embodiment are formed in different layers. In other words, the source electrode 160s and the drain electrode 160d are formed in different layers that are located at different levels from the substrate 110. This eliminates the need to separate the source electrode 160s and the drain electrode 160d in the horizontal direction of the substrate, thus reducing the length (channel length L) of the channel region.

The channel region is a region of the semiconductor layer 140 that is located between the contact holes 150a and 150b. That is, the channel length L is a distance between the contact holes 150a and 150b as illustrated in FIGS. 4, 5A, and 5B.

Since the source electrode 160s and the drain electrode 160d are formed in different layers as illustrated in FIGS. 5A and 5B, the source electrode 160s and the drain electrode 160d are not electrically connected to each other even if the distance (interelectrode distance D) between the source electrode 160s and the drain electrode 160d in the horizontal direction of the substrate is reduced. Thus, for example, the channel region can be covered with the source electrode 160s and the drain electrode 160d in a plan view. That is, the interelectrode distance D can be set to zero.

Figure 6:
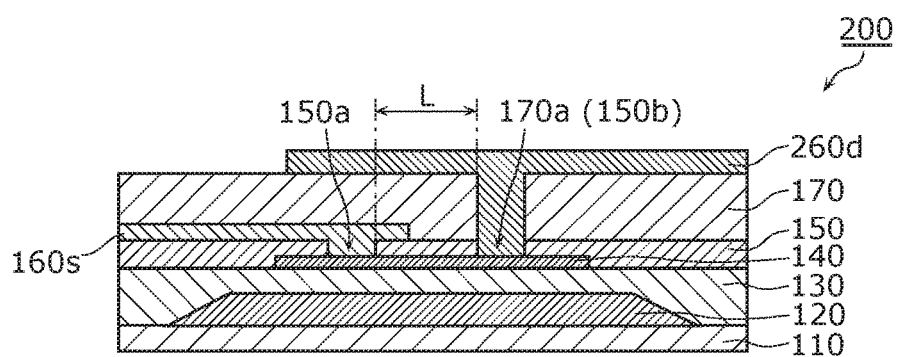
FIG. 6 is a schematic cross-sectional view of another exemplary thin-film transistor according to the embodiment.

Alternatively, a drain electrode 260d may be formed to cover part of the source electrode 160s as illustrated in FIG. 6. FIG. 6 illustrates another exemplary thin-film transistor according to the present embodiment.

A thin-film transistor 200 in FIG. 6 differs from the thin-film transistor 100 illustrated in FIG. 5A in that the drain electrode 260d is provided, instead of the drain electrode 160d.

The drain electrode 260d is identical to the drain electrode 160d, except that it covers part of the source electrode 160s. For example, the film thickness and material of the drain electrode 260d are the same as those of the drain electrode 160d.

In this way, the channel layer of the semiconductor layer 140 may be covered with at least one of the source electrode 160s and the drain electrode 260d in a plan view. Specifically, the semiconductor layer 140 may be covered with at least one of the source electrode 160s and the drain electrode 260d in a plan view.

When at least one of the source electrode 160s and the drain electrode 260d is made of a light shielding material and the semiconductor layer 140 is an oxide semiconductor, degradation of characteristics of the thin-film transistor 200 due to photo-deterioration of the semiconductor layer 140 can be suppressed by suppressing the arrival of light from the outside of the thin-film transistor 200 at the semiconductor layer 140.

When the semiconductor layer 140 is a silicon semiconductor, the generation of carriers due to photoexcitation of the semiconductor layer 140 can be suppressed by suppressing the arrival of light from the outside of the thin-film transistor 200 at the semiconductor layer 140, and this suppresses the off-state current of the thin-film transistor 200.

The contact region is located within the gate electrode 120 in a plan view as illustrated in FIG. 4, FIGS. 5A and 5B. In other words, the contact region is located in a direction that is immediately above the gate electrode 120.

More specifically, the contact holes 150a and 170a are located within the gate electrode 120 in a plan view. In other words, the contact holes 150a and 170a are located in a direction that is immediately above the gate electrode 120.

This configuration allows the state of the semiconductor layer in the contact region to be controlled by the gate voltage applied to the gate electrode 120. That is, this configuration suppresses formation of a high-resistance region in the contact region, thus suppressing an increase in the on-state resistance.

It is further desirable to locate the channel region within the gate electrode 120. In other words, the channel region is located in a direction that is immediately above the gate electrode 120.

More specifically, the semiconductor layer 140 is located within the gate electrode 120 in a plan view. In other words, the semiconductor layer 140 is located in a direction that is immediately above the gate electrode 120.

This configuration allows the entire channel region to be controlled by the gate voltage applied to the gate electrode 120. That is, this configuration suppresses the formation of a high-resistance region in the channel region, thus suppressing an increase in the on-state resistance.

Method of Manufacturing Thin-Film Transistor

Next, a method of manufacturing the thin-film transistor according to the present embodiment will be described with reference to FIGS. 7 to 13. FIGS. 7 to 13 are schematic cross-sectional views illustrating a method of manufacturing the thin-film transistor 100 according to the present embodiment.

Figure 7:
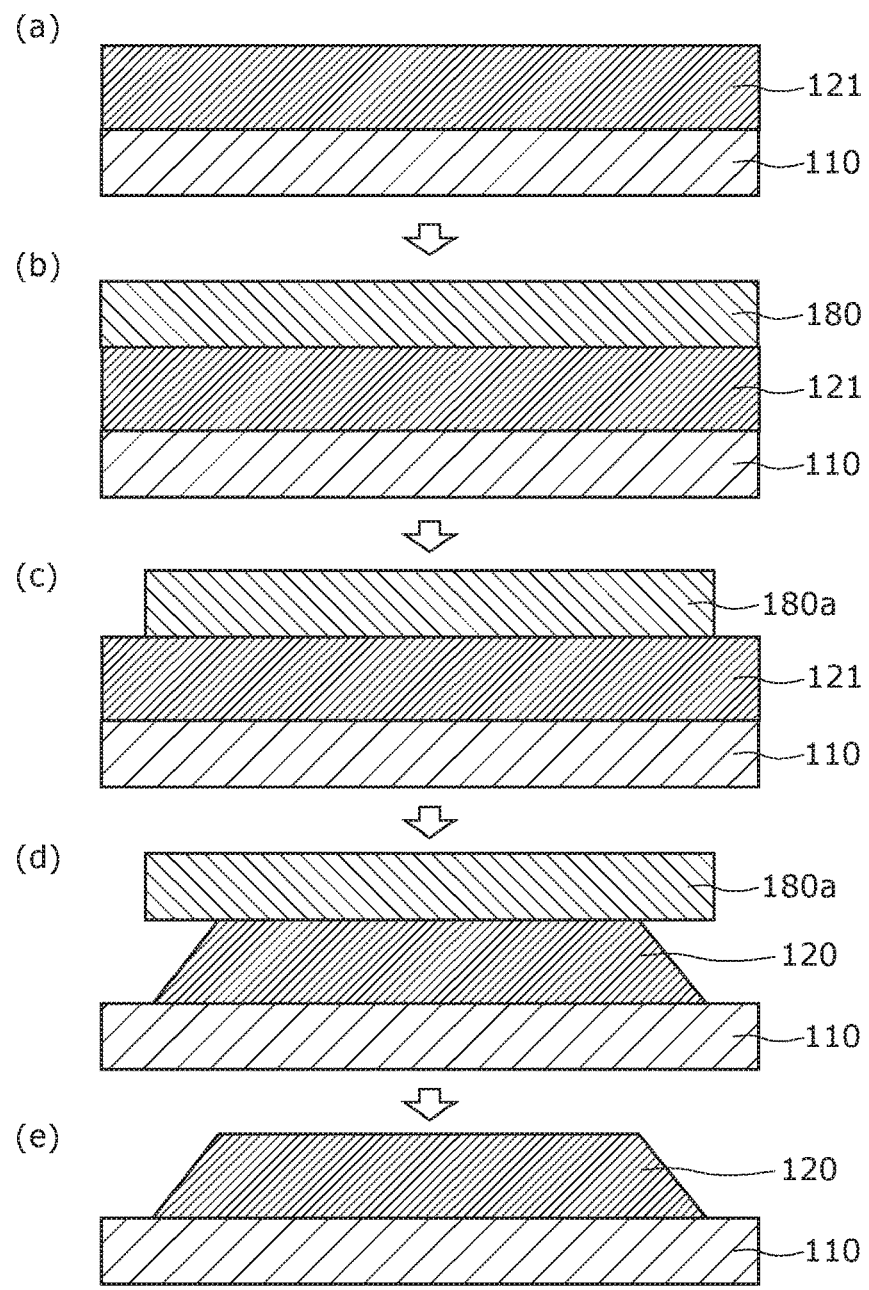
FIG. 7 is a schematic cross-sectional view illustrating in (a)-(e) a method of manufacturing the thin-film transistor according to the embodiment.

First, the substrate 110 is prepared and the gate electrode 120 having a predetermined shape is formed on the substrate 110 as illustrated in FIG. 7.

Specifically, first, a metal film 121 is deposited on the substrate 110 as illustrated in (a) of FIG. 7. For example, a glass substrate is prepared as the substrate 110, and a molybdenum film (Mo film) and a copper film (Cu film) are sequentially deposited by sputtering on the substrate 110. A total film thicknesses of the Mo film and the Cu film may, for example, be in the range of 20 nm to 500 nm.

Then, a resist 180 is formed on the metal film 121 as illustrated in (b) of FIG. 7. The resist 180 may, for example, be a photoresist made of a high-molecular compound that contains photosensitive functional molecules. The resist 180 is formed by applying the photoresist to the metal film 121 with a spin coater or the like and performing pre-baking. Note that the resist 180 has a film thickness of, for example, approximately 2 μm.

The resist 180 is then processed into a resist 180a that is patterned in a predetermined shape as illustrated in (c) of FIG. 7. For example, the resist 180a is formed by sequentially performing exposure, development, and post-baking using a mask that is formed to the shape of the gate electrode 120.

Then, part of the metal film 121 is wet etched using the resist 180a as a mask to form the gate electrode 120 having a predetermined shape as illustrated in (d) of FIG. 7. For example, the wet etching of the Mo film and the Cu film can be performed using a chemical solution that is obtained by mixing a hydrogen peroxide solution ($H_2O_2$) and an organic acid.

The resist 180a is then stripped off as illustrated in (e) of FIG. 7. For example, the resist 180a is stripped off by ashing using oxygen plasma.

Figure 8:
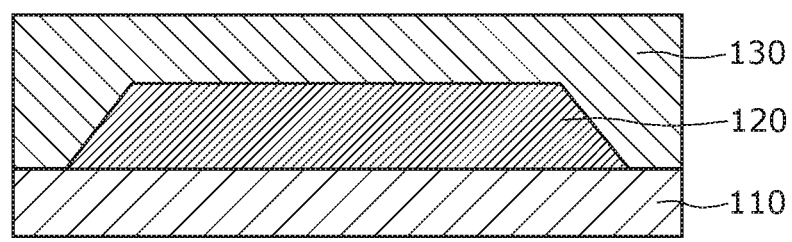
FIG. 8 is a schematic cross-sectional view illustrating the method of manufacturing the thin-film transistor according to the embodiment.

Next, the gate insulating layer 130 is formed on the gate electrode 120 as illustrated in FIG. 8. For example, the gate insulating layer 130 is deposited by plasma chemical vapor deposition (CVD) on the substrate 110 and on the gate electrode 120.

Specifically, a silicon nitride film and a silicon oxide film are sequentially deposited by plasma CVD on the substrate 110 to cover the gate electrode 120, thus forming the gate insulating layer 130. The gate insulating layer 130 has a film thickness of, for example, 50 nm to 300 nm.

The silicon nitride film can deposited by, for example, using silane gas ($SiH_4$), ammonia gas ($NH_3$), and nitrogen gas ($N_2$) as introduction gas. The silicon oxide film can be deposited by, for example, using silane gas ($SiH_4$) and nitrous oxide gas ($N_2O$) as introduction gas.

Figure 9:
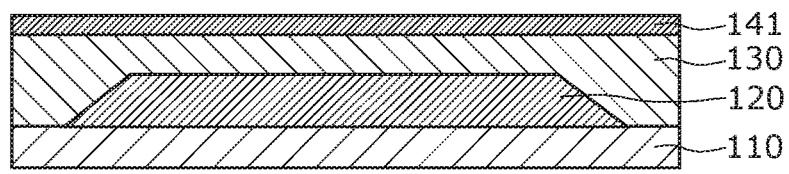
FIG. 9 is a schematic cross-sectional view illustrating in (a)-(e) the method of manufacturing the thin-film transistor according to the embodiment.
Figure 9:
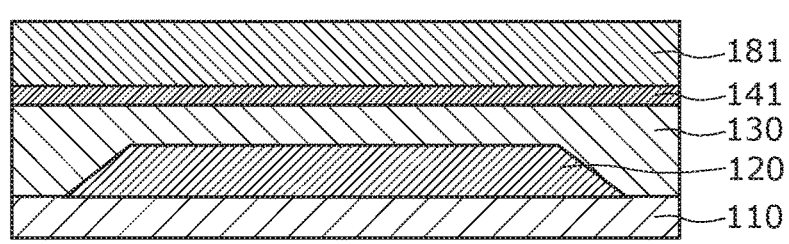
Figure 9:
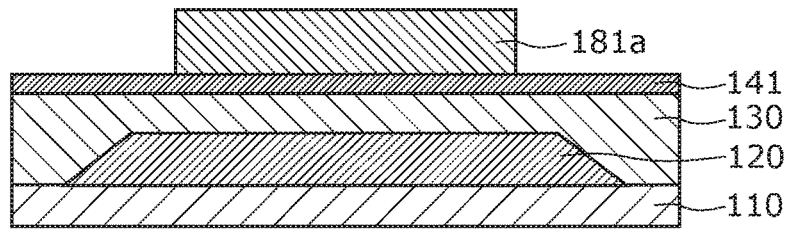
Figure 9:
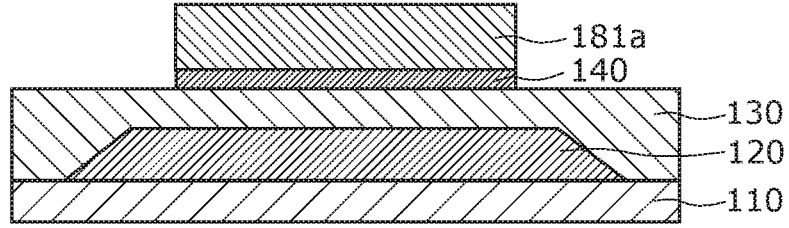
Figure 9:
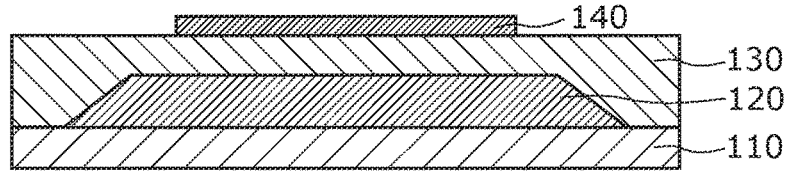

Next, the semiconductor layer 140 is formed at a position facing the gate electrode 120 above the substrate 110 as illustrated in FIG. 9.

Specifically, first, a semiconductor film 141 is deposited at a position facing the gate electrode 120 above the substrate 110 as illustrated in (a) of FIG. 9. For example, the semiconductor film 141 is deposited by sputtering on the gate insulating layer 130. The semiconductor film 141 has a film thickness of, for example, 20 nm to 200 nm.

Specifically, an amorphous InGaZnO film is deposited on the gate insulating layer 130 by sputtering using a target material in which the composition ratio of In, Ga, and Zn is 1:1:1, in a mixed gas atmosphere of oxygen and argon (Ar).

Then, a resist 181 is formed on the semiconductor film 141 as illustrated in (b) of FIG. 9. The resist 181 may, for example, be a photoresist. The resist 181 is formed by applying the photoresist to the semiconductor film 141 with a spin coater or the like and performing pre-baking. The resist 181 has a film thickness of, for example, approximately 2 μm.

The resist 181 is then processed into a resist 181a that is patterned in a predetermined shape as illustrated in (c) of FIG. 9. For example, the resist 181a is formed by sequentially performing exposure, development, and post-baking using a mask that is formed to the shape of the semiconductor layer 140.

Then, part of the semiconductor film 141 is wet etched using the resist 181 as a mask to form the semiconductor layer 140 having a predetermined shape as illustrated in (d) of FIG. 9. For example, the wet etching of the InGaZnO film can be performed using a chemical solution that is obtained by mixing a phosphoric acid ($H_3PO_4$), a nitric acid ($HNO_3$), an acetic acid ($CH_3COOH$), and water.

The resist 181a is then stripped off as illustrated in (e) of FIG. 9. For example, the resist 181a is stripped off by ashing using oxygen plasma.

Figure 10:
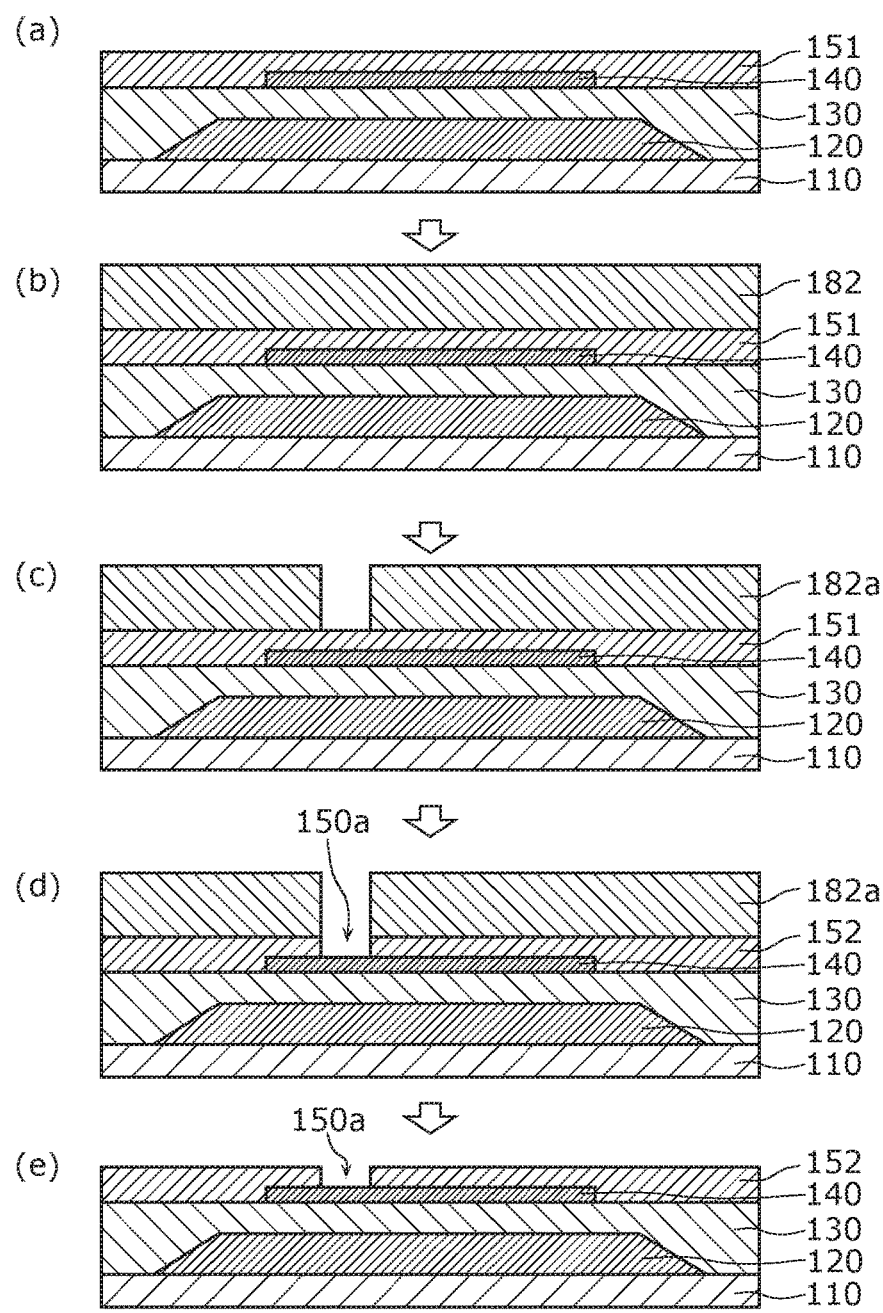
FIG. 10 is a schematic cross-sectional view illustrating in (a)-(e) the method of manufacturing the thin-film transistor according to the embodiment.

Next, a channel protective layer 152 having the contact hole 150a is formed on the semiconductor layer 140 and on the gate insulating layer 130 as illustrated in FIG. 10.

Specifically, a channel protective film 151 is deposited on the semiconductor layer 140 and on the gate insulating layer 130 as illustrated in (a) of FIG. 10. For example, the channel protective film 151 is deposited on the semiconductor layer 140 and on the gate insulating layer 130 to cover the semiconductor layer 140.

Specifically, the channel protective film 151 can be formed by depositing a silicon oxide film on the entire surface by plasma CVD. The silicon oxide film has a film thickness of, for example, 50 nm to 500 nm. The silicon oxide film can be deposited by, for example, using silane gas ($SiH_4$) and nitrous oxide gas ($N_2O$) as instruction gas.

Then, a resist 182 is formed on the channel protective film 151 as illustrated in (b) of FIG. 10. The resist 182 may, for example, be a photoresist. The resist 182 is formed by applying the photoresist to the channel protective film 151 with a spin coater or the like and performing pre-baking. The resist 182 has a film thickness of, for example, approximately 2 μm.

The resist 182 is then processed into a resist 182a that is patterned in a predetermined shape as illustrated in (c) of FIG. 10. For example, the resist 182a is formed by sequentially performing exposure, development, and post-baking using a mask that is formed to the shape of the contact hole 150a.

Then, part of the channel protective film 151 is dry etched using the resist 182a as a mask to form the channel protective layer 152 having the contact hole 150a in a predetermined region as illustrated in (d) of FIG. 10. Note that the contact hole 150a is formed to expose the source contact region of the semiconductor layer 140.

When, for example, the channel protective film 151 is a silicon oxide film, reactive ion etching (RIE) can be used as dry etching. At this time, examples of the etching gas include carbon tetrafluoride ($CF_4$) and an oxygen gas ($O_2$). Parameters such as gas flow rate, pressure, applied electric power, and frequency are appropriately set according to, for example, substrate size and film thickness to be etched.

The resist 182a is then stripped off as illustrated in (e) of FIG. 10. For example, the resist 182a is stripped off by ashing using oxygen plasma.

Figure 11:
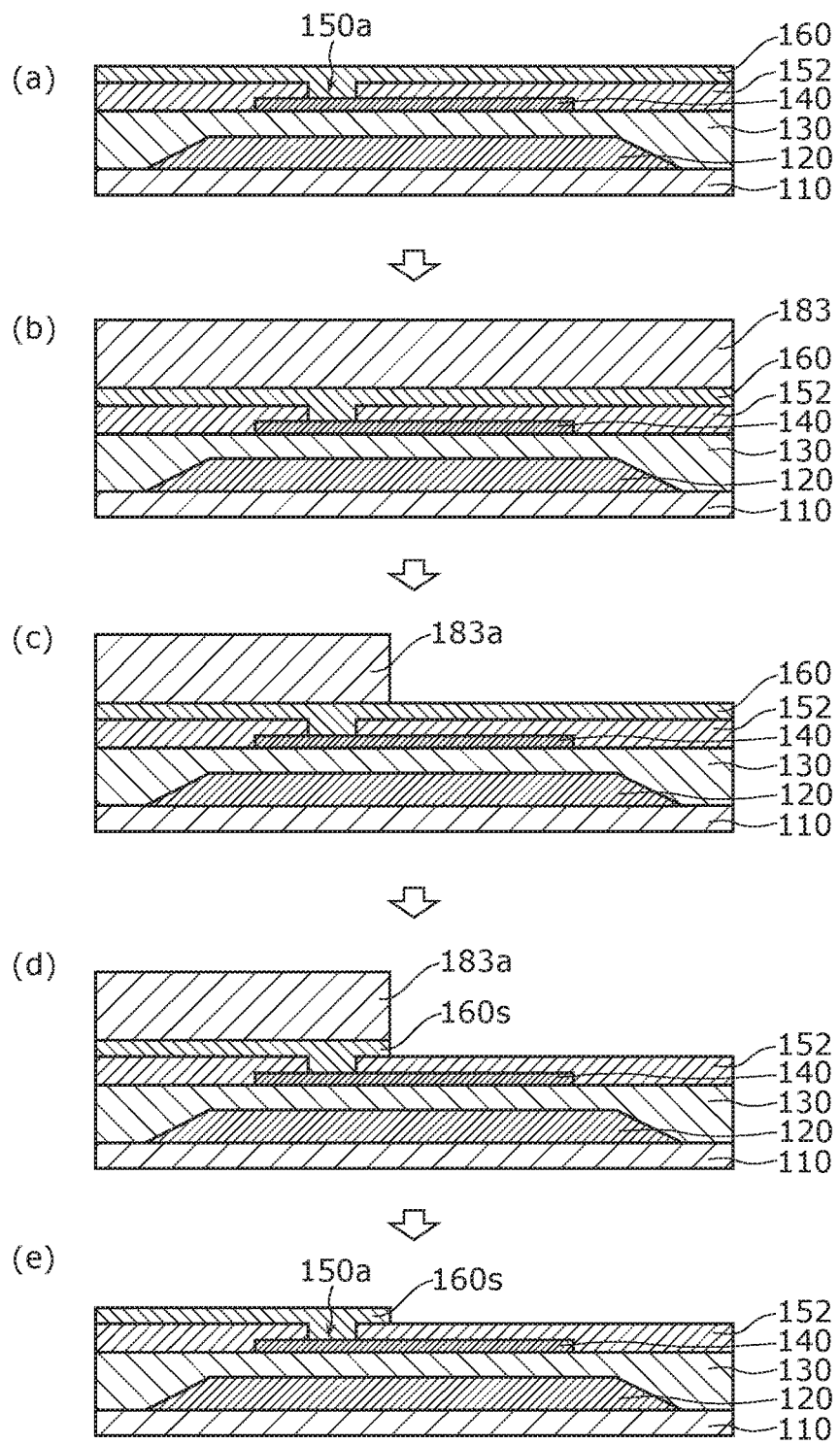
FIG. 11 is a schematic cross-sectional view illustrating in (a)-(e) the method of manufacturing the thin-film transistor according to the embodiment.

Next, the source electrode 160s that is connected through the contact hole 150a to the semiconductor layer 140 is formed as illustrated in FIG. 11.

Specifically, first, a metal film 160 is formed to be connected to the semiconductor layer 140 through the contact hole 150a as illustrated in (a) of FIG. 11. Specifically, the metal film 160 is deposited on the channel protective layer 152 and in the contact hole 150a.

For example, the metal film 160 is formed by sequentially depositing an Mo film, a Cu film, and a CuMn film by sputtering on the channel protective layer 152 and in the contact hole 150a. The metal film 160 has a film thickness of, for example, 100 nm to 500 nm.

Then, a resist 183 is formed on the metal film 160 as illustrated in (b) of FIG. 11. The resist 183 may, for example, be a photoresist. The resist 183 is formed by applying the photoresist to the metal film 160 with a spin coater or the like and performing pre-baking. The resist 183 has a film thickness of, for example, approximately 2 μm.

The resist 183 is then processed into a resist 183a that is patterned in a predetermined shape as illustrated in (c) of FIG. 11. For example, the resist 183a is formed by sequentially performing exposure, development, and post-baking using a mask that is formed to the shape of the source electrode 160s.

Then, part of the metal film 160 is wet etched using the resist 183a as a mask to form the source electrode 160s having a predetermined shape as illustrated in (d) of FIG. 11. For example, the wet etching of the Mo film, the Cu film, and the CuMn film can be performed using a chemical solution that is obtained by mixing a hydrogen peroxide solution ($H_2O_2$) and an organic acid.

The resist 183a is then stripped off as illustrated in (e) of FIG. 11. For example, the resist 183a is stripped off by ashing using oxygen plasma.

Figure 12:
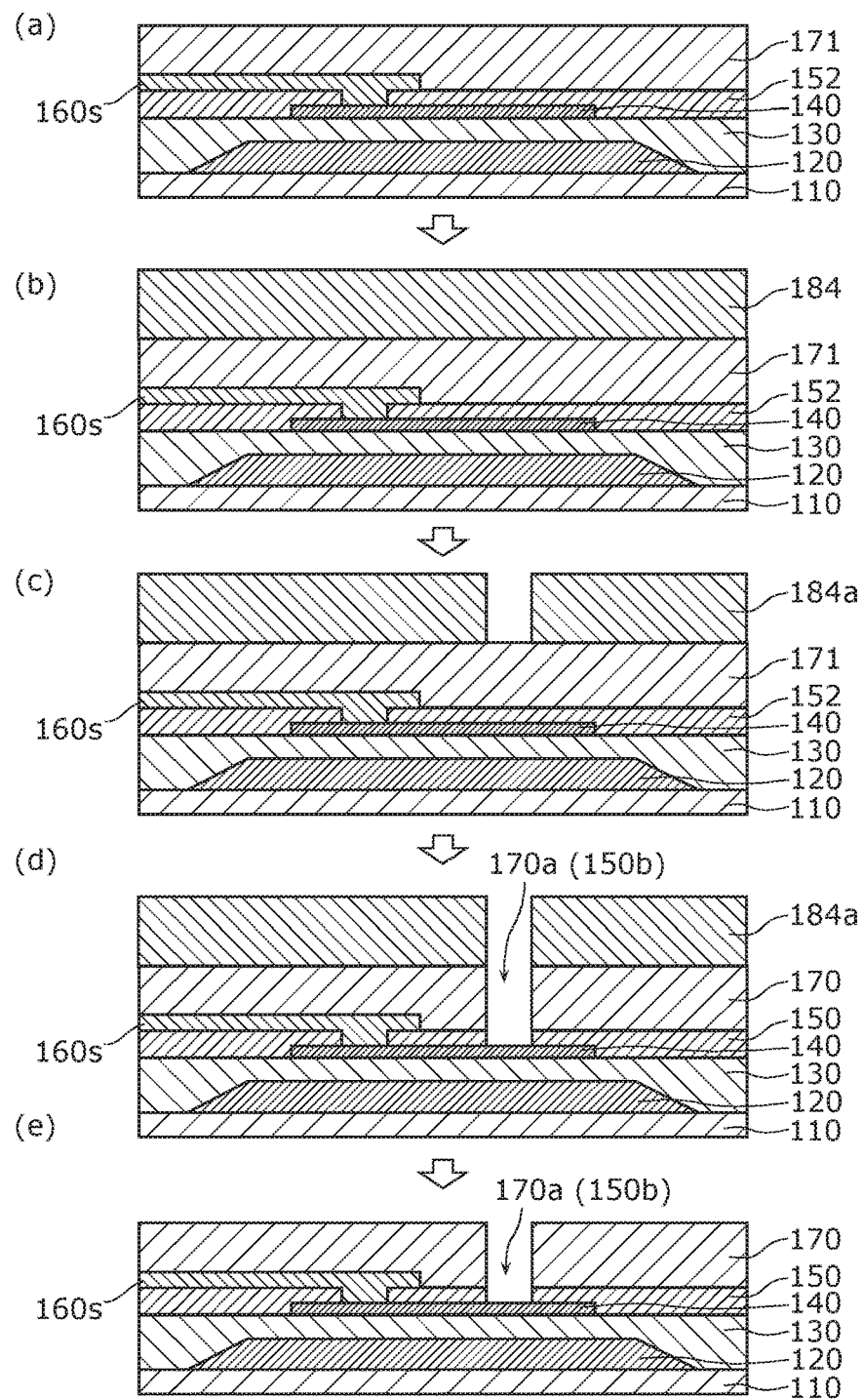
FIG. 12 is a schematic cross-sectional view illustrating in (a)-(e) the method of manufacturing the thin-film transistor according to the embodiment.

Next, the interlayer insulating layer 170 having the contact hole 170a is formed on the source electrode 160s and on the channel protective layer 150 as illustrated in FIG. 12.

Specifically, an interlayer insulation film 171 is deposited on the source electrode 160s and on the channel protective layer 152 as illustrated in (a) of FIG. 12. For example, the interlayer insulation film 171 is deposited on the source electrode 160s and on the channel protective layer 152 to cover the source electrode 160s.

Specifically, the interlayer insulation film 171 can be formed by depositing a silicon oxide film on the entire surface by plasma CVD. For example, the silicon oxide film has a film thickness of 50 nm to 500 nm. The silicon oxide film can be deposited by, for example, using silane gas ($SiH_4$) and nitrous oxide gas ($N_2O$) as introduction gas.

Then, a resist 184 is formed on the interlayer insulation film 171 as illustrated in (b) of FIG. 12. The resist 184 may, for example, be a photoresist. The resist 184 is formed by applying the photoresist to the interlayer insulation film 171 with a spin coater or the like and performing pre-baking. The resist 184 has a film thickness of, for example, approximately 2 μm.

The resist 184 is then processed into a resist 184a that is patterned in a predetermined shape as illustrated in (c) of FIG. 12. For example, the resist 184a is formed by sequentially performing exposure, development, and post-baking using a mask that is formed to the shape of the contact hole 170a.

Then, part of the interlayer insulation film 171 and part of the channel protective layer 152 are dry etched using the resist 184a as a mask to form the interlayer insulating layer 170 having the contact hole 170a in a predetermined region and the channel protective layer 150 having the contact hole 150b in a predetermined region as illustrated in (d) of FIG. 12. Note that the contact hole 170a and the contact hole 150b are formed to expose the drain contact region of the semiconductor layer 140.

When, for example, the interlayer insulation film 171 and the channel protective layer 152 are silicon oxide films, reactive ion etching (RIE) can be used as dry etching. At this time, examples of the etching gas include carbon tetrafluoride ($CF_4$) and an oxygen gas ($O_2$). Parameters such as gas flow rate, pressure, applied electric power, and frequency are appropriately set according to, for example, substrate size and film thickness to be etched.

The resist 184a is then stripped off as illustrated in (e) of FIG. 12. For example, the resist 184a is stripped off by ashing using oxygen plasma.

While an example of forming the contact holes 170a and 150b in a single step has been described, the present invention is not limited to this example. The contact holes 170a and 150b may be formed in different steps.

Figure 13:
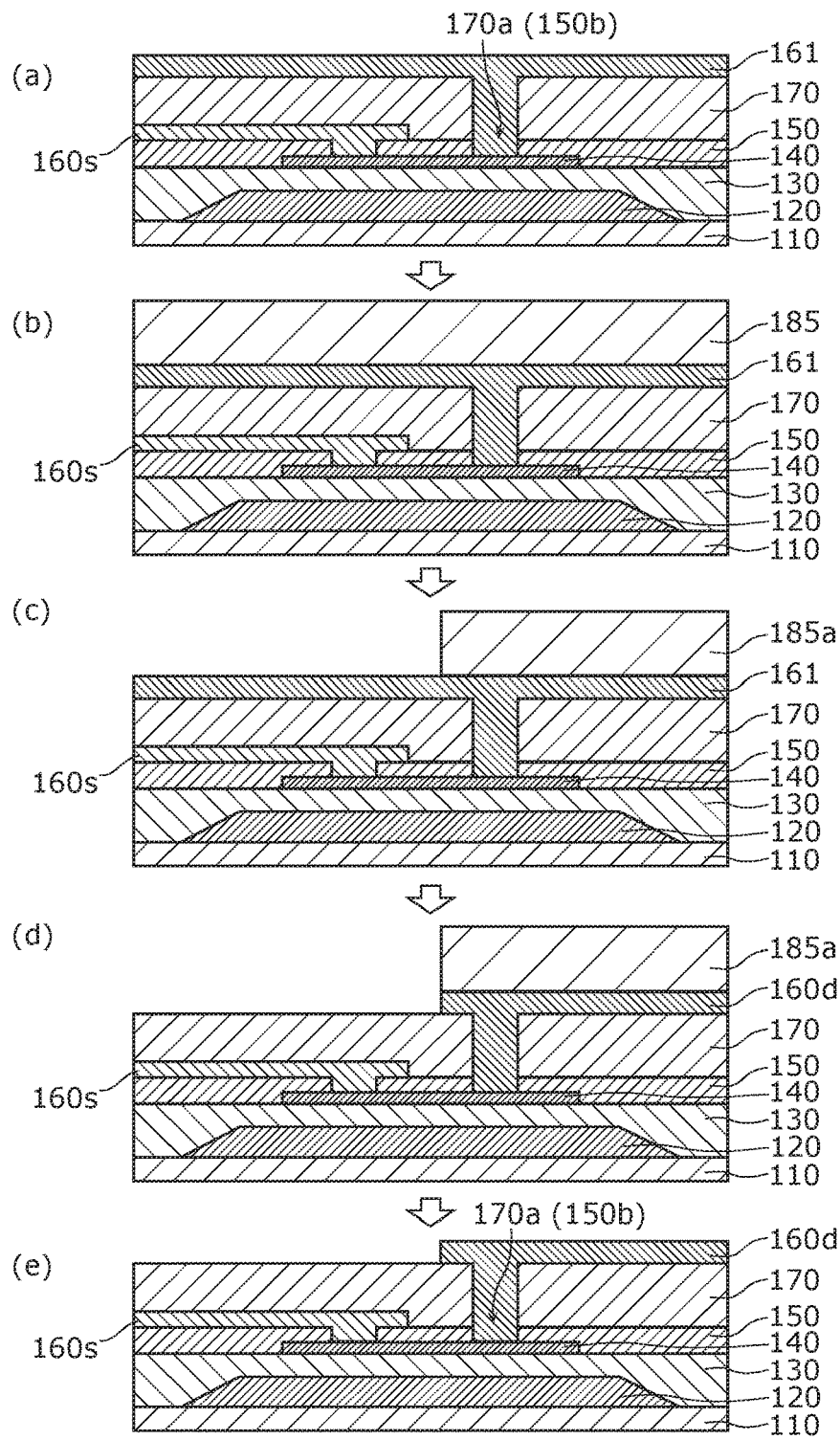
FIG. 13 is a schematic cross-sectional view illustrating in (a)-(e) the method of manufacturing the thin-film transistor according to the embodiment.

Next, the drain electrode 160d that is connected through the contact holes 170a and 150b to the semiconductor layer 140 is formed as illustrated in FIG. 13.

Specifically, first, a metal film 161 is formed to be connected to the semiconductor layer 140 through the contact holes 170a and 150b as illustrated in (a) of FIG. 13. Specifically, the metal film 161 is deposited on the interlayer insulating layer 170 and in the contact holes 170a and 150b.

For example, the metal film 161 is formed by sequentially depositing an Mo film, a Cu film, and a CuMn film by sputtering on the interlayer insulating layer 170 and in the contact holes 170a and 150b. The metal film 161 has a film thickness of, for example, 100 nm to 500 nm.

Then, a resist 185 is formed on the metal film 161 as illustrated in (b) of FIG. 13. The resist 185 may, for example, be a photoresist. The resist 185 is formed by applying the photoresist to the metal film 161 with a spin coater or the like and performing pre-baking. The resist 185 has a film thickness of, for example, approximately 2 μm.

The resist 185 is then processed into a resist 185a that is patterned in a predetermined shape as illustrated in (c) of FIG. 13. For example, the resist 185a is formed by sequentially performing exposure, development, and post-baking using a mask that is formed to the shape of the drain electrode 160d.

Then, part of the metal film 161 is wet etched using the resist 185a as a mask to form the drain electrode 160d having a predetermined shape as illustrated in (d) of FIG. 13. For example, the wet etching of the Mo film, the Cu film, and the CuMn film can be performed using a chemical solution that is obtained by mixing a hydrogen peroxide solution ($H_2O_2$) and an organic acid.

The resist 185a is then stripped off as illustrated in (e) of FIG. 13. For example, the resist 185a is stripped off by ashing using oxygen plasma.

The thin-film transistor 100 illustrated in FIGS. 5A and 5B can be manufactured as described above.

Figure 14:
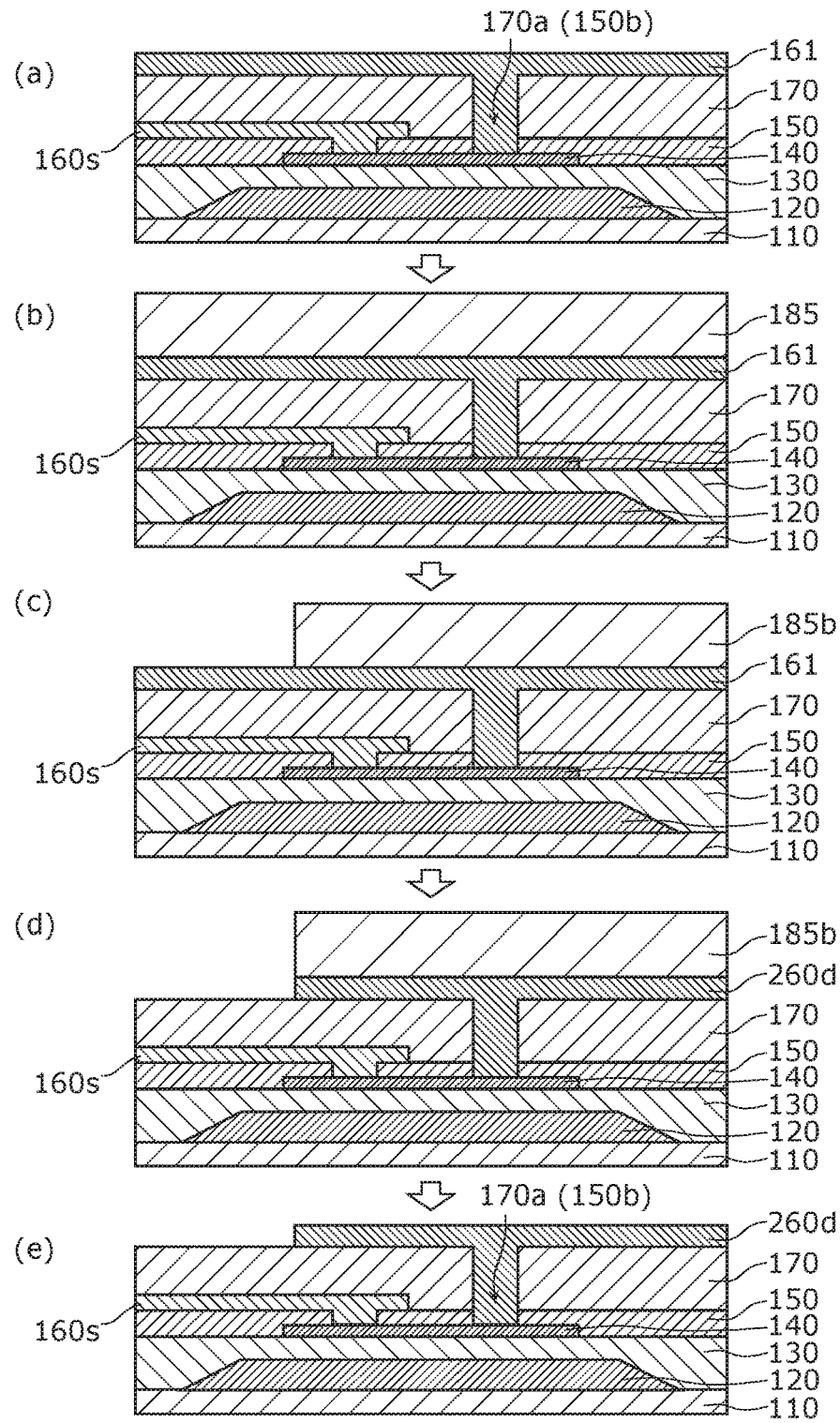
FIG. 14 is a schematic cross-sectional view illustrating in (a)-(e) a method of manufacturing another exemplary thin-film transistor according to the embodiment.

The thin-film transistor 200 illustrated in FIG. 6 can also be manufactured in a similar manner. More specifically, the thin-film transistor 200 can be manufactured by performing steps similar to those in FIGS. 7 to 12 and then performing steps illustrated in FIG. 14. FIG. 14 is a schematic cross-sectional view illustrating a method of manufacturing the thin-film transistor 200 according to the present embodiment.

The drain electrode 260d that is connected through the contact holes 170a and 150b to the semiconductor layer 140 is formed as illustrated in FIG. 14. FIG. 14 differs from FIG. 13 in the shape of the patterned resist 185.

Specifically, the resist 185 is processed into a resist 185b that is patterned in a predetermined shape as illustrated in (c) of FIG. 14. For example, the resist 185b is formed by sequentially performing exposure, development, and post-baking using a mask that is formed to the shape of the drain electrode 260d.

In this way, the shape of the resist 185b differs from the shape of the resist 185a illustrated in FIG. 13. That is, the resist 185b is patterned in a shape that matches the shape of the drain electrode 260d that covers part of the source electrode 160s.

Then, part of the metal film 161 is wet etched using the resist 185b as a mask to form the drain electrode 260d having a predetermined shape as illustrated in (d) of FIG. 14. For example, the wet etching of the Mo film, the Cu film, and the CuMn film can be performed using a chemical solution obtained by mixing a hydrogen peroxide solution ($H_2O_2$) and an organic acid.

The resist 185b is then stripped off as illustrated in (e) of FIG. 14. For example, the resist 185b is stripped off by ashing using oxygen plasma.

The thin-film transistor 200 illustrated in FIG. 6 can be manufactured as described above.

Summary

As described above, the display device according to the present embodiment is the organic EL display device 10 including the pixel circuit 31 that includes the thin-film transistor 100. The thin-film transistor 100 includes the gate electrode 120, the semiconductor layer 140 formed above the gate electrode 120, the gate insulating layer 130 formed between the gate electrode 120 and the semiconductor layer 140, the channel protective layer 150 formed on the semiconductor layer 140, and the source electrode 160s and the drain electrode 160d that are formed above the channel protective layer 150 and electrically connected to the semiconductor layer 140. The source electrode 160s and the drain electrode 160d are formed in different layers.

This configuration eliminates the need to separate the source electrode 160s and the drain electrode 160d in the horizontal direction of the substrate, thus reducing the channel length L. Reducing the channel length L reduces the on-state resistance and improves the characteristics of the thin-film transistor 100.

Figure 15:
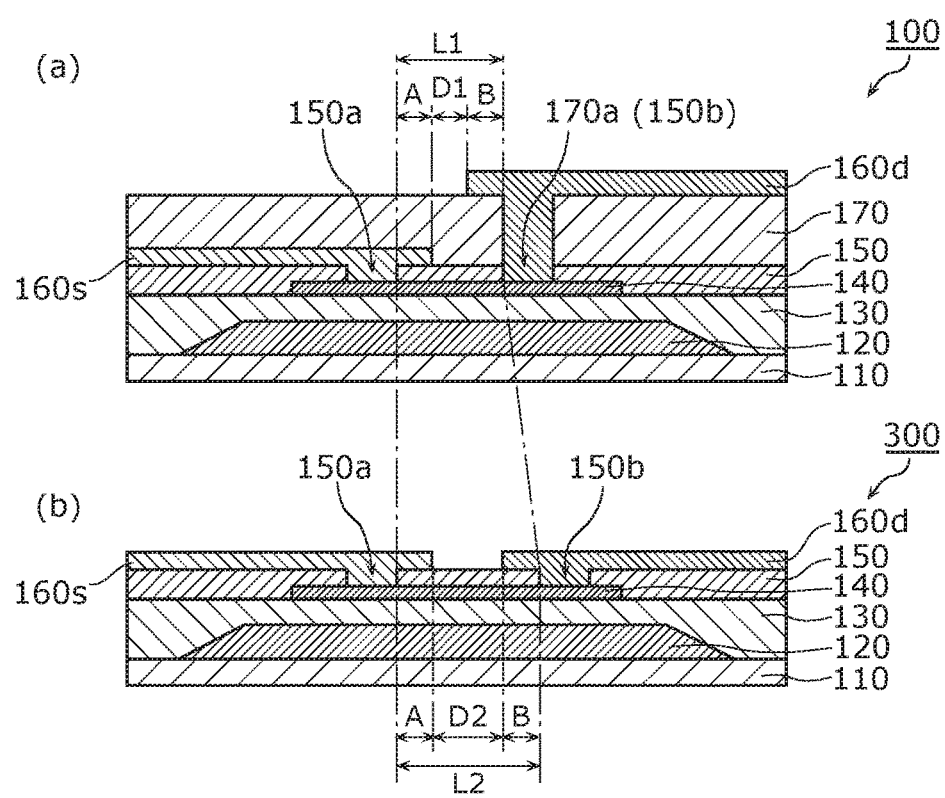
FIG. 15 is a schematic cross-sectional view for describing in (a) and (b) a channel length when a source electrode and a drain electrode according to the embodiment are formed in the same layer and when they are formed in different layers.

FIG. 15 is a schematic cross-sectional view for describing the channel length when the source electrode 160s and the drain electrode 160d of the present embodiment are formed in the same layer and when they are formed in different layers.

When, for example, the source electrode 160s and the drain electrode 160d are formed in the same layer as in a thin-film transistor 300 illustrated in (b) of FIG. 15, the source electrode 160s and the drain electrode 160d need to be separated from each other in the horizontal direction of the substrate. That is, it is necessary to ensure that an interelectrode distance D2 illustrated in (b) of FIG. 15 is set to a fixed value or more. For example, the source electrode 160s and the drain electrode 160d is separated by 4 μm from each other.

It is also preferable for the source electrode 160s and the drain electrode 160d to reliably cover the exposed parts of the semiconductor layer 140 within the contact holes in order to establish good contact with the semiconductor layer 140. Thus, the source electrode 160s and the drain electrode 160d are formed to extend off the edges of the contact holes by predetermined widths in a plan view. That is, the source electrode 160s extends off the contact hole 150a by a width A and the drain electrode 160d extends off the contact hole 150b by a width B as illustrated in (a) and (b) of FIG. 15. The widths A and B may, for example, be 4 μm.

Accordingly, when the source electrode 160s and the drain electrode 160d are formed in the same layer as in conventional technology, a channel length L2 that is the distance between the contact holes 150a and 150b may, for example, be 12 μm.

On the other hand, in the thin-film transistor 100 according to the present embodiment, the source electrode 160s and the drain electrode 160d are formed in different layers. Thus, there is no need to separate the source electrode 160s and the drain electrode 160d in the horizontal direction, and the channel length can be set to a smaller value than 12 μm. For example, an interelectrode distance D1 can be set to a smaller value, e.g., 2 μm, than the interelectrode distance D2 as illustrated in (a) of FIG. 15, and in the present example, the channel length L1 is set to 10 μm. Alternatively, the interelectrode distance D may be set to zero or a negative value (i.e., the source electrode 160s and the drain electrode 260d overlap) as illustrated in FIG. 6.

Reducing the channel length L enables the area of the thin-film transistor 100 in the pixel layout to be reduced. That is, it is possible to achieve a reduction in the on-state resistance and high definition of pixels.

When the channel layer of the semiconductor layer 140 is covered with at least one of the source electrode 160s and the drain electrode 260d that are made of a light shielding material in a plan view, the arrival of light from the outside of the thin-film transistor 100 at the semiconductor layer 140 can be suppressed. This suppresses degradation of the characteristics of the thin-film transistor 100 due to photo-deterioration of the semiconductor layer 140.

Since the channel region is located in the direction immediately above the gate electrode 120, the entire channel region can be controlled by the gate voltage applied to the gate electrode 120. That is, it is possible to suppress the formation of a high-resistance region in the channel region and an increase in the on-state resistance.

Other Embodiments

As described above, embodiments of the present disclosure are described by way of example of the technique disclosed in the present application. The technique of the present disclosure is, however, not limited to these embodiments and is also applicable to other embodiments obtained by appropriate modifications, replacements, addition, and omission.

For example, while the source electrode 160s is formed on the channel protective layer 150 and the drain electrode 160d is formed on the interlayer insulating layer 170 in the above-described embodiment, the positions at which the source electrode 160s and the drain electrode 160d are formed may be reversed.

Figure 16:
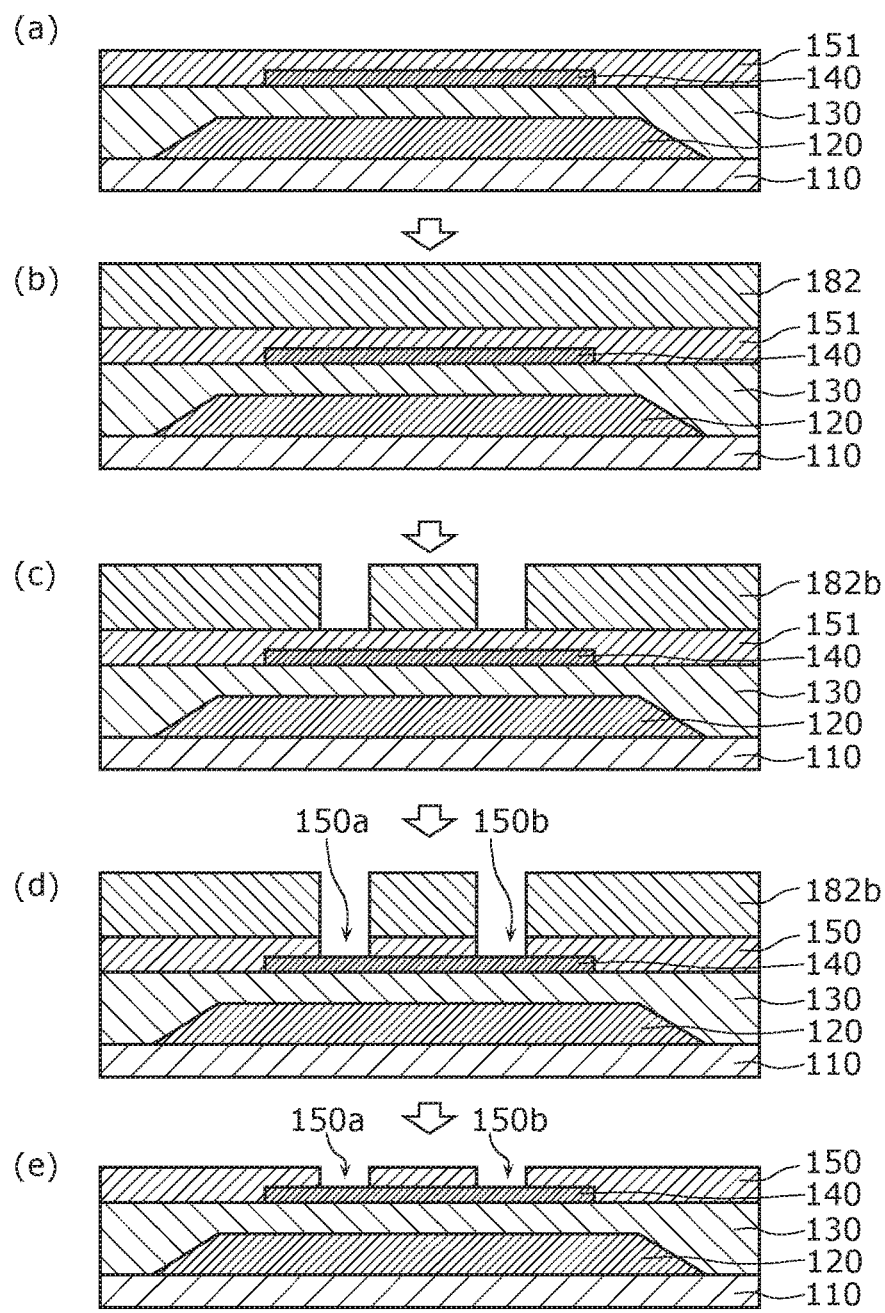
FIG. 16 is a schematic cross-sectional view illustrating in (a)-(e) a method of manufacturing a thin-film transistor according to a variation of the embodiment.
Figure 17:
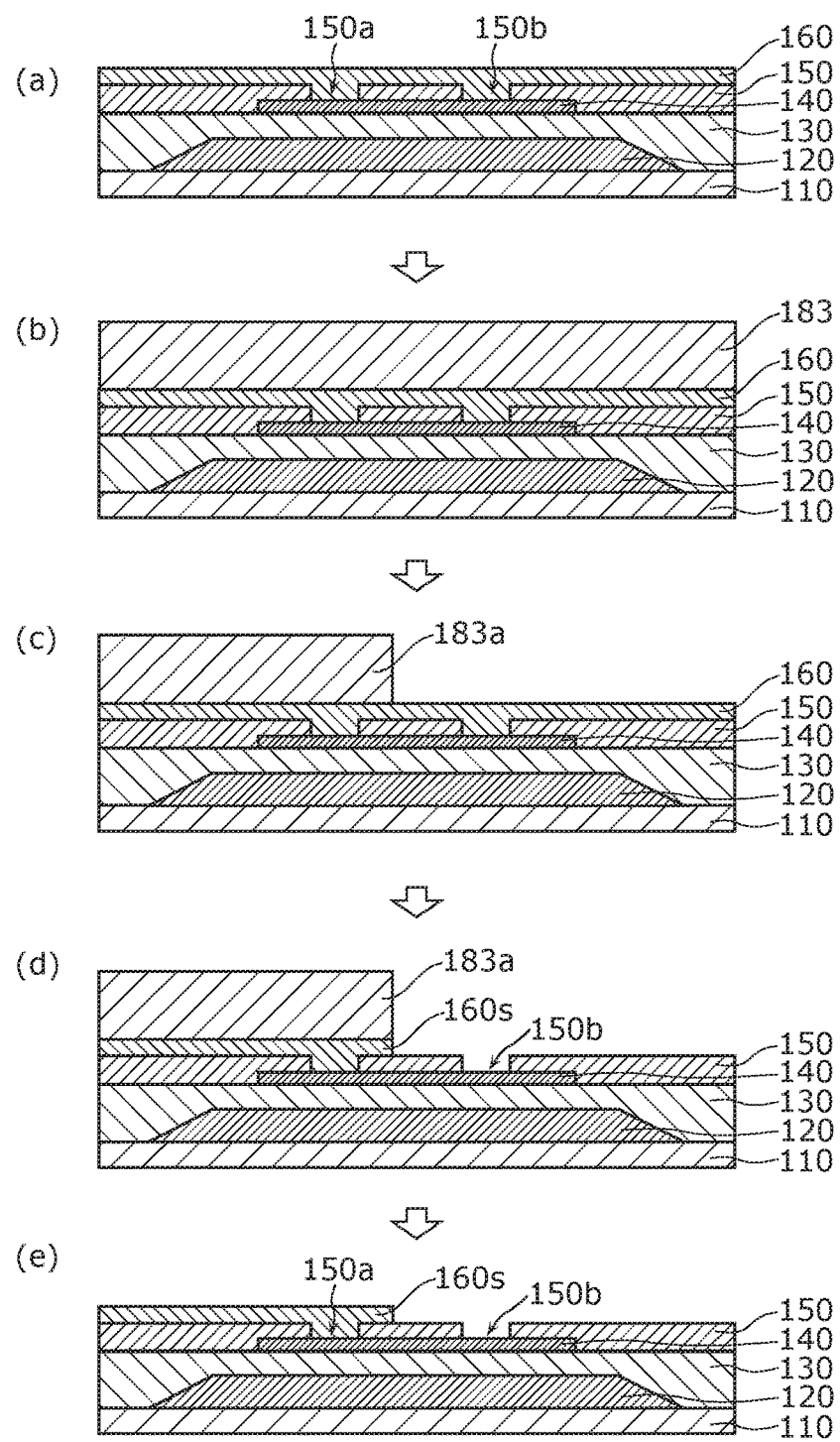
FIG. 17 is a schematic cross-sectional view illustrating in (a)-(e) the method of manufacturing the thin-film transistor according to the variation of the embodiment.
Figure 18:
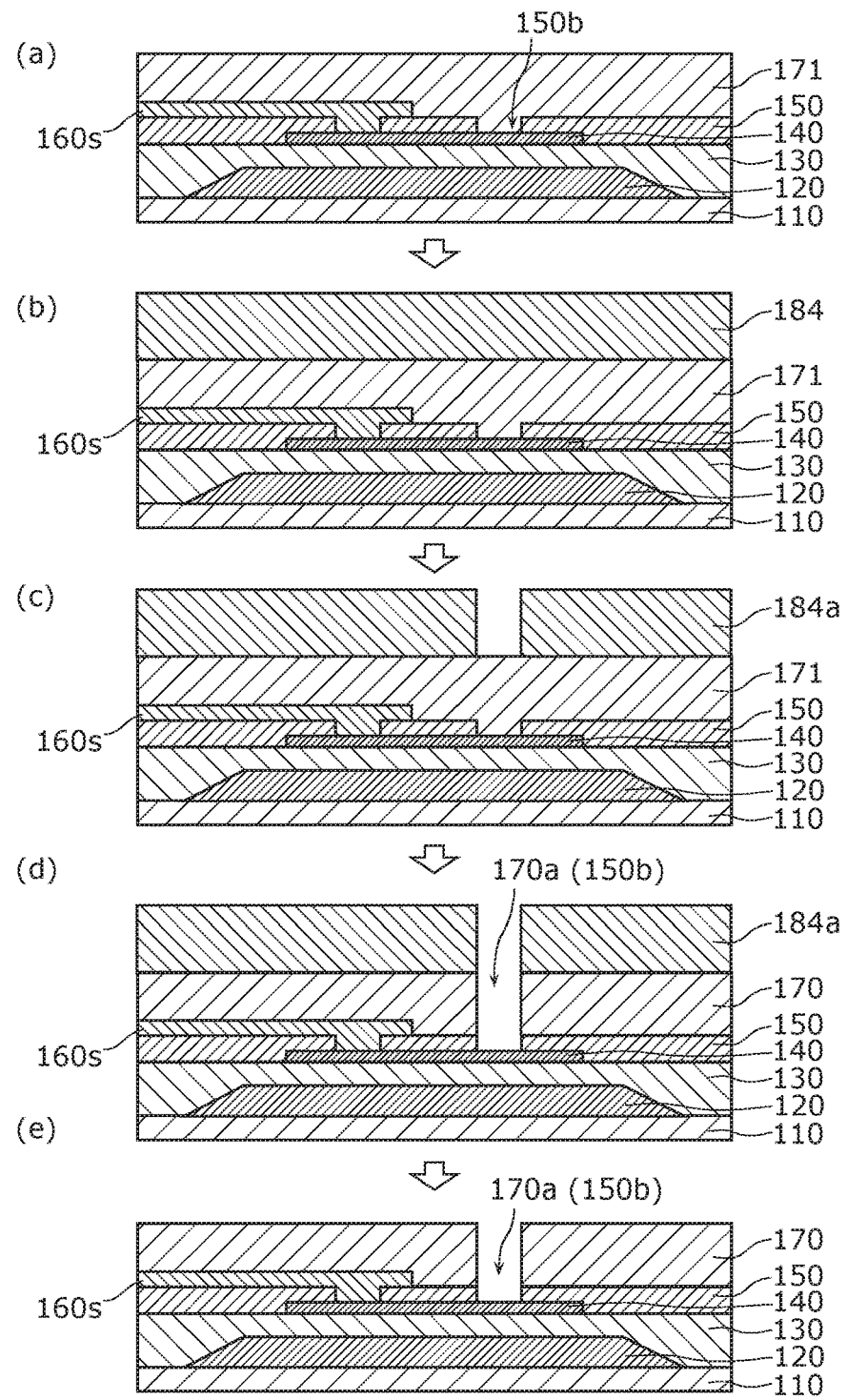
FIG. 18 is a schematic cross-sectional view illustrating in (a)-(e) the method of manufacturing the thin-film transistor according to the variation of the embodiment.

The contact hole 150b may be formed at the same time as the contact hole 150a is formed in the channel protective layer 150. A specific example will be described with reference to FIGS. 16 to 18. FIGS. 16 to 18 are schematic cross-sectional views illustrating a method of manufacturing a thin-film transistor according to a variation of the embodiment.

The method of manufacturing a thin-film transistor according to this variation differs from the method illustrated in FIG. 10 in that the resist 182 is processed into a different shape as illustrated in (c) of FIG. 16. Specifically, the resist 182 is processed into a resist 182b that is patterned in a predetermined shape. For example, the resist 182b is formed by sequentially performing exposure, development, and post-baking using a mask that is formed to the shapes of the contact holes 150a and 150b.

Then, part of the channel protective film 151 is dry etched using the resist 182b as a mask to form the channel protective layer 150 having the contact holes 150a and 150b in predetermined regions as illustrated in (d) of FIG. 16.

The resist 182b is then stripped off as illustrated in (e) of FIG. 16. For example, the resist 182b is stripped off by ashing using oxygen plasma.

As described above, the contact holes 150a and 150b can be formed at the same time.

In subsequent steps, the contact hole 150b is filled with a deposited material, and therefore it is necessary to remove the material by etching or other techniques. In the step of forming the source electrode 160s as illustrated in FIG. 17, for example, the contact hole 150b is filled with the metal film 160 (see (a) of FIG. 17).

Thus, the metal film 160 filling the contact hole 150b is also removed at the time of wet etching the metal film 160 as illustrated in (d) of FIG. 17. Note that when the source electrode 160s and the drain electrode 160d are made of the same material, there is no need to remove the metal film 160 from the contact hole 150b.

In the step of forming the interlayer insulating layer 170 as illustrated in FIG. 18, the contact hole 150b is filled with the interlayer insulation film 171 (see (a) of FIG. 18). Thus, when the contact hole 170a is formed, the interlayer insulation film 171 is etched until the semiconductor layer 140 is exposed as illustrated in (d) of FIG. 18.

While in the above-described embodiment, the contact hole 150a is formed after the channel protective film 151 has been deposited on the entire surface as illustrated in FIG. 10, the present invention is not limited to this example. For example, it is possible to form a channel protective layer 152 that is patterned in advance in a predetermined shape to expose the semiconductor layer 140.

That is, in the step of forming the channel protective layer 150, the channel protective layer 150 need only be formed to expose part of the semiconductor layer 140. In the step of forming the source electrode 160s and the drain electrode 160d, the source electrode 160s and the drain electrode 160d need only be formed to be connected to the exposed parts of the semiconductor layer 140.

The same applies to the formation of layers such as the semiconductor layer 140 that need to be patterned in a predetermined shape. That is, the semiconductor layer 140 that is patterned in advance in a predetermined shape may be formed, instead of patterning the layer after deposition on the entire surface.

In the embodiments described above, the oxide semiconductor used as the semiconductor layer is not limited to amorphous InGaZnO. For example, the oxide semiconductor may be a polycrystalline semiconductor such as polycrystalline InGaO.

While the above embodiments describe the configurations of the thin-film transistors that include an oxide semiconductor layer, the present invention is not limited to this example. The thin-film transistor may include a semiconductor layer that is made primarily of a semiconducting material that is not an oxide, such as a single crystalline semiconductor or a compound semiconductor. One example is silicon (Si) having a crystal or non-crystal structure.

While the above embodiments describe the organic EL display device as a display device using thin-film transistors, the thin-film transistors of the above embodiments are also applicable to other display devices using an active matrix substrate, such as liquid crystal display devices.

The display device of the above embodiments may include or may not include driving circuits such as a gate driver and a source driver.

The display device (display panel) such as the above-described organic EL display device is usable as a flat panel display and is applicable to various types of electronic devices such as TV sets, personal computers, or mobile phones that include a display panel. In particular, the display device is suitable for large-screen, high definition display devices.

Other embodiments are also intended to be included within the scope of the present invention, such as those obtained by making various modifications conceived by those skilled in the art to the above-described embodiments and variations, and those achieved by arbitrarily combining the constituent elements and functions of the above-described embodiments and variations without departing from the scope of the invention of the present disclosure.

INDUSTRIAL APPLICABILITY

The display device and the thin-film transistor substrate according to the present disclosure are, for example, applicable to display devices such as organic EL display devices.

The invention claimed is:
1. A display device comprising a pixel circuit that includes a thin-film transistor,
   the thin-film transistor including:
      a gate electrode;
      a semiconductor layer above the gate electrode, the semiconductor layer including a channel region;
      a gate insulating layer between the gate electrode and the semiconductor layer;
      a first insulating layer on the semiconductor layer; and
      a source electrode and a drain electrode that are above the first insulating layer and electrically connected to the semiconductor layer, wherein the source electrode and the drain electrode are in different layers, and
the channel region of the semiconductor layer is entirely covered by the source electrode and the drain electrode in a plan view, with an interelectrode distance being zero.

2. The display device according to claim 1, wherein the first insulating layer includes:
a first contact hole for connecting the source electrode to the semiconductor layer; and
a second contact hole for connecting the drain electrode to the semiconductor layer, and
the channel region of the semiconductor layer is between the first contact hole and the second contact hole and located within the gate electrode in the plan view.

3. The display device according to claim 2, wherein the semiconductor layer is located within the gate electrode in the plan view.

4. The display device according to claim 1, wherein the first insulating layer includes:
a first contact hole for connecting the source electrode to the semiconductor layer; and
a second contact hole for connecting the drain electrode to the semiconductor layer, and
the channel region of the semiconductor layer is between the first contact hole and the second contact hole.

5. The display device according to claim 4, wherein the semiconductor layer is covered with at least one of the source electrode and the drain electrode in the plan view.

6. The display device according to claim 4, wherein the source electrode and the drain electrode are made of a light shielding material.

7. The display device according to claim 1, wherein the thin-film transistor further includes a second insulating layer above the first insulating layer,
one of the source electrode and the drain electrode is on the first insulating layer, and
the other of the source electrode and the drain electrode is on the second insulating layer.

8. The display device according to claim 1, wherein the thin-film transistor is a driving transistor for driving a light-emitting device of the pixel circuit, and
the source electrode is above the drain electrode.

9. The display device according to claim 1, further comprising an organic light-emitting device above the thin-film transistor.

10. A thin-film transistor substrate including a thin-film transistor, the thin-film transistor substrate comprising:
a gate electrode;
a semiconductor layer above the gate electrode, the semiconductor layer including a channel region;
a gate insulating layer between the gate electrode and the semiconductor layer;
an insulating layer on the semiconductor layer; and
a source electrode and a drain electrode that are above the insulating layer and electrically connected to the semiconductor layer,
wherein the source electrode and the drain electrode are in different layers, and
the channel region of the semiconductor layer is entirely covered by the source electrode and the drain electrode in a plan view, with an interelectrode distance being zero.

11. The display device according to claim 1, wherein the first insulating layer includes a first contact hole for connecting the source electrode to the semiconductor layer and a second contact hole for connecting the drain electrode to the semiconductor layer,
the channel region of the semiconductor layer is between the first contact hole and the second contact hole and located within the gate electrode in the plan view, and
at least one of the first contact hole or the second contact hole is located within the gate electrode in the plan view.

12. The display device according to claim 1, wherein the first insulating layer includes a first contact hole for connecting the source electrode to the semiconductor layer and a second contact hole for connecting the drain electrode to the semiconductor layer,
the channel region of the semiconductor layer is between the first contact hole and the second contact hole and located within the gate electrode in the plan view, and
each of the first contact hole and the second contact hole is located within the gate electrode in the plan view.

13. The display device according to claim 1, wherein the first insulating layer includes a first contact hole for connecting the source electrode to the semiconductor layer and a second contact hole for connecting the drain electrode to the semiconductor layer,
the channel region of the semiconductor layer is between the first contact hole and the second contact hole and located within the gate electrode in the plan view, and
the first contact hole is entirely covered by the drain electrode in the plan view.

* * * * *